US006502306B2

(12) United States Patent
Silverbrook

(10) Patent No.: US 6,502,306 B2
(45) Date of Patent: Jan. 7, 2003

(54) METHOD OF FABRICATING A MICRO-ELECTROMECHANICAL SYSTEMS DEVICE

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

(21) Appl. No.: 10/183,711

(22) Filed: Jun. 28, 2002

(65) Prior Publication Data

US 2002/0174541 A1 Nov. 28, 2002

Related U.S. Application Data

(63) Continuation of application No. 09/575,125, filed on May 23, 2000.

(51) Int. Cl.[7] .................................................. H01L 21/00
(52) U.S. Cl. .......................... 29/890.1; 438/21; 216/27; 347/20; 347/47; 347/63
(58) Field of Search .......................... 29/890.1; 438/21; 216/27; 347/20, 27, 44, 47, 54, 55, 56, 57, 63

(56) References Cited

U.S. PATENT DOCUMENTS

| | | |
|---|---|---|
| 4,633,267 A | 12/1986 | Meinhof |
| 5,905,517 A | 5/1999 | Silverbrook |
| 5,909,230 A | 6/1999 | Choi et al. |
| 6,010,254 A | 1/2000 | Sanada |
| 6,132,028 A | 10/2000 | Su et al. |
| 6,180,427 B1 | 1/2001 | Silverbrook |
| 6,228,668 B1 | 5/2001 | Silverbrook |
| 6,416,167 B1 | 7/2002 | Silverbrook |

FOREIGN PATENT DOCUMENTS

| | | |
|---|---|---|
| EP | 0812689 A1 | 12/1997 |
| JP | 402030543 A | 1/1990 |
| JP | 404001051 A | 1/2002 |

*Primary Examiner*—Gregory Huson
*Assistant Examiner*—Peter deVore

(57) ABSTRACT

A method of fabricating a micro-electromechanical systems (MEMS) device that is positioned on a wafer substrate that incorporates drive circuitry includes depositing a first sacrificial layer of an organic material on the wafer substrate. The first sacrificial layer is patterned. A first layer of conductive material is deposited on the first sacrificial layer. The first layer of conductive material is patterned. A second sacrificial layer of organic material is deposited on the first layer of conductive material. The second sacrificial layer is patterned. A second layer of conductive material is deposited on the second sacrificial layer. The second layer of conductive material patterned. A third sacrificial layer of organic material is deposited on the second layer of conductive material. The third sacrificial layer is patterned. A structural layer of dielectric material is deposited on the third sacrificial layer. The structural layer is patterned. The sacrificial layers are removed to release MEMS structures defined by the first and second layers of conductive material.

5 Claims, 27 Drawing Sheets

METHOD OF FABRICATING A MICRO-ELECTROMECHANICAL SYSTEMS DEVICE

REFERENCES TO RELATED APPLICATIONS

This application is a continuation application of U.S. application Ser. No. 09/575,125. Various methods, systems and apparatus relating to the present invention are disclosed in the following co-pending applications filed by the applicant or assignee of the present invention simultaneously with the present application: Ser. Nos. 09/575,197 09/575,195 09/575,159 09/575,132 09/575,123 09/575,148 09/575,130 09/575,165 09/575,153 09/575,118 09/575,131 09/575,116 09/575,144 09/575,139 09/575,186 09/575,185 09/575,191 09/575,145 09/575,192 09/575,181 09/575,193 9/575,156 09/575,183 09/575,160 09/575,150 09/575,169 09/575,184 09/575,128 09/575,180 09/575,149 09/575,179 09/575,133 09/575,143 09/575,187 09/575,155 09/575,196 09/575,198 09/575,178 09/575,164 09/575,146 09/575,174 09/575,163 09/575,168 09/575,154 09/575,129 09/575,124 09/575,188 09/575,189 09/575,162 09/575,172 09/575,170 09/575,171 09/575,161 09/575,141 09/575,125 09/575,142 09/575,140 09/575,190 09/575,138 09/575,126 09/575,127 09/575,158 09/575,117 09/575,147 09/575,152 09/575,176 09/575,151 09/575,177 09/575,175 09/575,115 09/575,114 09/575,113 09/575,112 09/575,111 09/575,108 09/575,109 09/575,182 09/575,173 09/575,194 09/575,136 09/575,119 09/575,135 09/575,157 09/575,166 09/575,134 09/575,121 09/575,137 09/575,167 09/575,120 09/575,122

These applications are incorporated by reference.

FIELD OF THE INVENTION

This invention relates to a method of fabricating a micro-electromechanical systems device.

BACKGROUND TO THE INVENTION

As set out in the material incorporated by reference, the Applicant has developed ink jet printheads that can span a print medium and incorporate up to 84 000 nozzle assemblies.

These printheads include a number of printhead chips. One of these is the subject of this invention. The printhead chips include micro-electromechanical components that physically act on ink to eject ink from the printhead chips.

The printhead chips are manufactured using integrated circuit fabrication techniques. Those skilled in the art know that such techniques involve deposition and etching processes. The processes are carried out until the desired integrated circuit is formed.

The micro-electromechanical components are by definition microscopic. It follows that integrated circuit fabrication techniques are particularly suited to the manufacture of such components. In particular, the techniques involve the use of sacrificial layers. The sacrificial layers support active layers. The active layers are shaped into components. The sacrificial layers are etched away to free the components.

Applicant has devised a new process for ma whereby two layers of organic sacrificial material can be used to support two layers of conductive material.

SUMMARY OF THE INVENTION

According to a first aspect of the invention, there is provided a method of fabricating a micro-electromechanical systems (MEMS) device that is positioned on a wafer substrate that incorporates drive circuitry, the method comprising the steps of depositing a first sacrificial layer of an organic material on the wafer substrate, patterning the first sacrificial layer, depositing a first conductive layer of conductive material on the first sacrificial layer, patterning the first conductive layer, depositing a second sacrificial layer of organic material on the first conductive layer, patterning the second sacrificial layer, depositing a second conductive layer of conductive material on the second sacrificial layer, patterning the second conductive layer, and removing the sacrificial layers to release MEMS structures defined by the first and second layers of conductive material.

The method may comprise the steps of depositing a third sacrificial layer of organic material on the second conductive layer, patterning the third sacrificial layer, depositing a structural layer of dielectric material on the third sacrificial layer, and patterning the structural layer.

The steps of depositing the sacrificial layers may comprise spinning on layers of photosensitive polyimide.

The steps of depositing and patterning the sacrificial material and conductive material and removing the sacrificial material may be carried out so that the conductive material defines an actuator that is electrically connected to the drive circuitry.

The steps of depositing and patterning the sacrificial material, the conductive material and the dielectric material and removing the sacrificial material may be carried out so that the dielectric material defines at least part of nozzle chamber walls and a roof wall that define a nozzle chamber and an ink ejection port in fluid communication with the nozzle chamber, the actuator being operatively positioned with respect to the nozzle chamber to eject ink from the ink ejection port.

According to a second aspect of the invention, there is provided a micro-electromechanical systems (MEMS) device that is the product of a process carried out according to the method described above.

In this specification, the device in question is a printhead chip for an inkjet printhead. It will be appreciated that the device can be any MEMS device.

In this specification, the term “nozzle” is to be understood as an element defining an opening and not the opening itself.

The nozzle may comprise a crown portion, defining the opening, and a skirt portion depending from the crown portion, the skirt portion forming a first part of a peripheral wall of the nozzle chamber.

The printhead chip may include an ink inlet aperture defined in a floor of the nozzle chamber, a bounding wall surrounding the aperture and defining a second part of the peripheral wall of the nozzle chamber. It will be appreciated that said skirt portion is displaceable relative to the substrate and, more particularly, towards and away from the substrate to effect ink ejection and nozzle chamber refill, respectively. Said bounding wall may then serve as an inhibiting means for inhibiting leakage of ink from the chamber. Preferably, the bounding wall has an inwardly directed lip portion or wiper portion, which serves a sealing purpose, due to the viscosity of the ink and the spacing between, said lip portion and the skirt portion, for inhibiting ink ejection when the nozzle is displaced towards the substrate.

Preferably, the actuator is a thermal bend actuator. Two beams may constitute the thermal bend actuator, one being an active beam and the other being a passive beam. By "active beam" is meant that a current is caused to flow through the active beam upon activation of the actuator whereas there is no current flow through the passive beam. It will be appreciated that, due to the construction of the actuator, when a current flows through the active beam it is caused to expand due to resistive heating. Due to the fact that the passive beam is constrained, a bending motion is imparted to the connecting member for effecting displacement of the nozzle.

The beams may be anchored at one end to an anchor mounted on, and extending upwardly from, the substrate and connected at their opposed ends to a connecting member. The connecting member may comprise an arm having a first end connected to the actuator with the second part of the nozzle chamber walls and the roof wall connected to an opposed end of the arm in a cantilevered manner. Thus, a bending moment at said first end of the arm is exaggerated at said opposed end to effect the required displacement of the second part of the nozzle chamber walls and roof wall.

BRIEF DESCRIPTION OF THE DRAWINGS

The invention is now described, by way of example, with reference to the accompanying diagrammatic drawings in which.

DETAILED DESCRIPTION OF THE DRAWINGS

Figure 1:
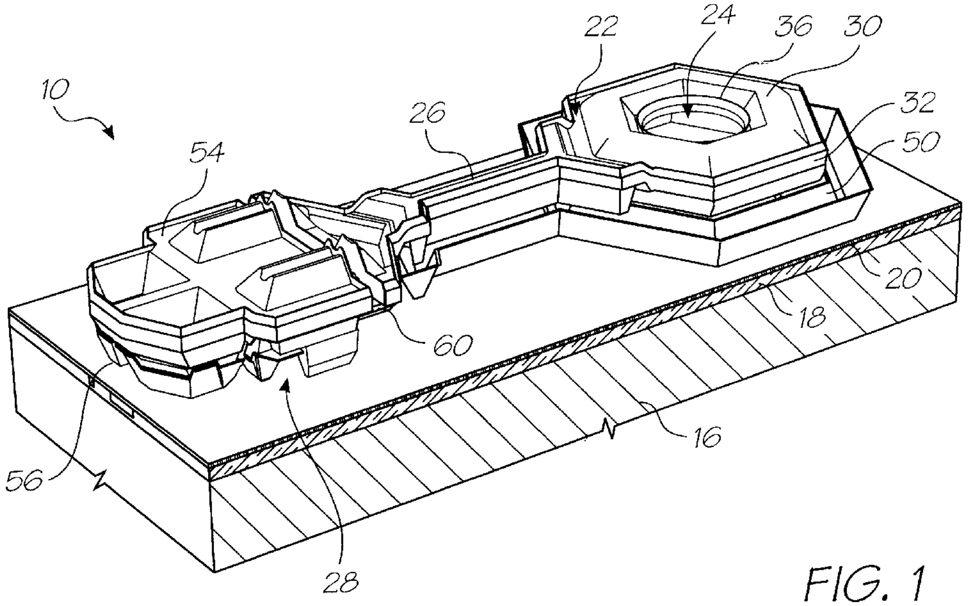
FIG. 1 shows a three dimensional, schematic view of a nozzle assembly of a printhead chip fabricated in accordance with a method of the invention.

In FIG. 1 of the drawings, a nozzle assembly of a printhead chip 14 (FIGS. 5 and 6) of the invention is designated generally by reference 10. The printhead chip 14 has a plurality of nozzle assemblies 10 arranged in an array on a wafer substrate in the form of a silicon substrate 16. The substrate 16 incorporates a drive circuitry layer in the form of a CMOS layer.

A dielectric layer 18 is deposited on the substrate 16. A CMOS passivation layer 20 is deposited on the dielectric layer 18 to protect the drive circuitry layer.

Each nozzle assembly 10 includes nozzle chamber walls 22 defining an ink ejection port 24 in a roof wall 30 and a nozzle chamber 34. The ink ejection port 24 is in fluid communication with the nozzle chamber 34. A lever arm 26 extends from the roof wall 30. An actuator 28 is anchored to the substrate 16 at one end and is connected to the lever arm 26 at an opposite end.

The roof wall is in the form of a crown portion 30. A skirt portion 32 depends from the crown portion 30. The skirt portion 32 forms a first part of a peripheral wall of the nozzle chamber 34.

Figure 2:
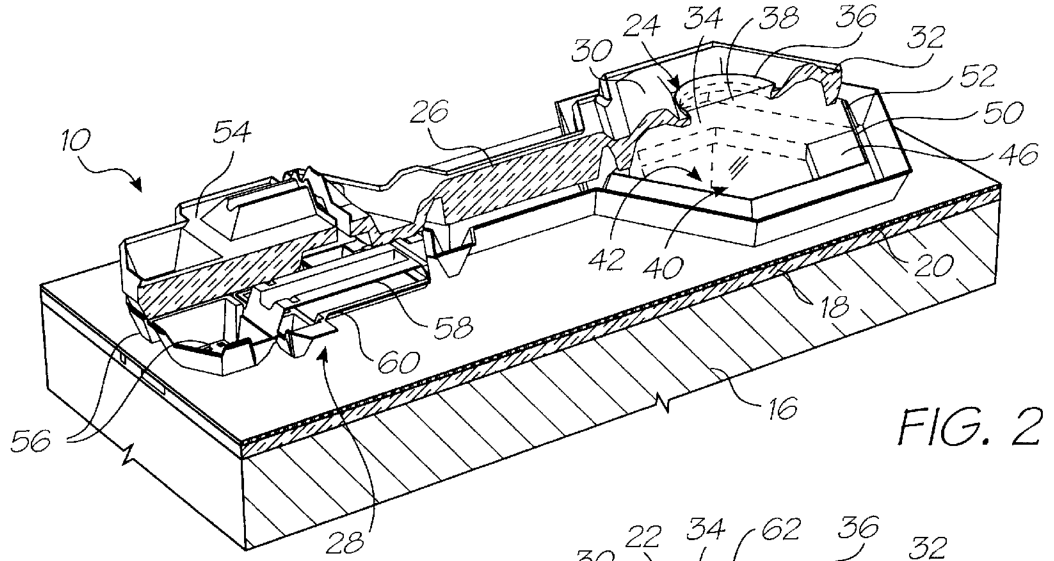
FIGS. 2 to 4 show a three dimensional, schematic illustration of an operation of a nozzle assembly of the printhead chip of FIG. 1.

The crown portion 30 defines a raised rim 36, which "pins" a meniscus 38 (FIG. 2) of a body of ink 40 in the nozzle chamber 34.

An ink inlet in the form of an aperture 42 (shown most clearly in FIG. 6 of the drawings) is defined in a floor 46 of the nozzle chamber 34. The aperture 42 is in fluid communication with an ink inlet channel 48 defined through the substrate 16.

A second part of the peripheral wall in the form of a wall portion 50 bounds the aperture 42 and extends upwardly from the floor 46.

The wall portion 50 has an inwardly directed lip 52 at its free end, which serves as a fluidic seal. The fluidic seal inhibits the escape of ink when the crown and skirt portions 30, 32 are displaced, as described in greater detail below.

It will be appreciated that, due to the viscosity of the ink 40 and the small dimensions of the spacing between the lip 52 and the skirt portion 32, the inwardly directed lip 52 and surface tension function as a seal for inhibiting the escape of ink from the nozzle chamber 34.

The actuator 28 is a thermal bend actuator and is connected to an anchor 54 extending upwardly from the substrate 16 o r, more particularly, from the CMOS passivati on layer 20. The anchor 54 is mounted on conductive pads 56 which form an electrical connection with the actuator 28.

The actuator 28 comprises a first, active beam 58 arranged above a second, passive beam 60. In a preferred embodiment, both beams 58 and 60 are of, or include, a conductive ceramic material such as titanium nitride (TiN).

Figure 3:
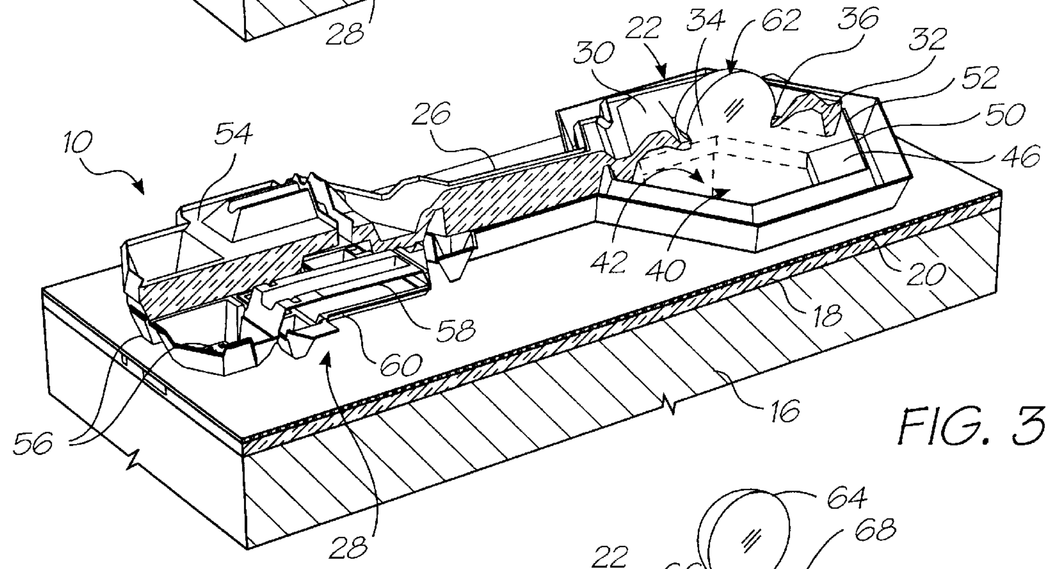
Figure 4:
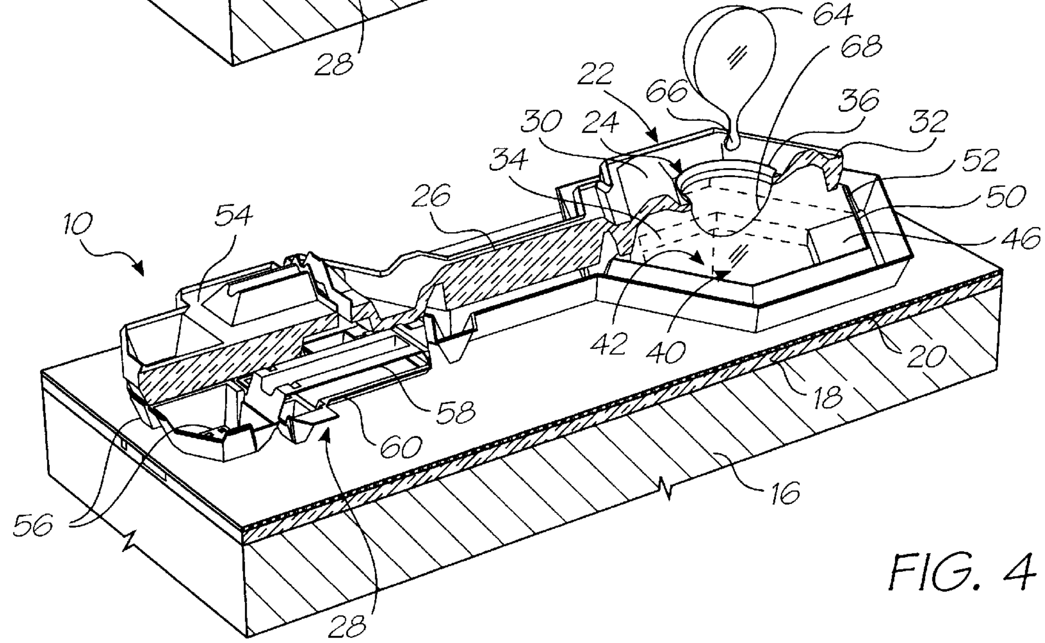

Both beams 58 and 60 have their first ends anchor ed to the anchor 54 and their opposed ends connected to the arm 26. When a current is caused to flow through the active beam 58 thermal expansion of the beam 58 results. As the passive beam 60, through which there is no current flow, does not expand at the same rate, a bending moment is created causing the arm 26 and thus the crown and skirt portions 30, 32 to be displaced downwardly towards the substrate 16 as shown in FIG. 3 of the drawings. This causes an ejection of ink through the ink ejection port 24 as shown at 62 in FIG. 3 of the drawings. When the source of heat is removed from the active beam 58, i.e. by stopping current flow, the portions 30, 32 return to a quiescent position as shown in FIG. 4 of the drawings. The return movement causes an ink droplet 64 to form as a result of the breaking of an ink droplet neck as illustrated at 66 in FIG. 4 of the drawings. The ink droplet 64 then travels on to the print media such as a sheet of paper. As a result of the formation of the ink droplet 64, a "negative" meniscus is formed as shown at 68 in FIG. 4 of the drawings. This "negative" meniscus 68 results in an inflow of ink 40 into the nozzle chamber 34 such that a new meniscus 38 (FIG. 2) is formed in readiness for the next ink drop ejection from the nozzle assembly 10.

Figure 5:
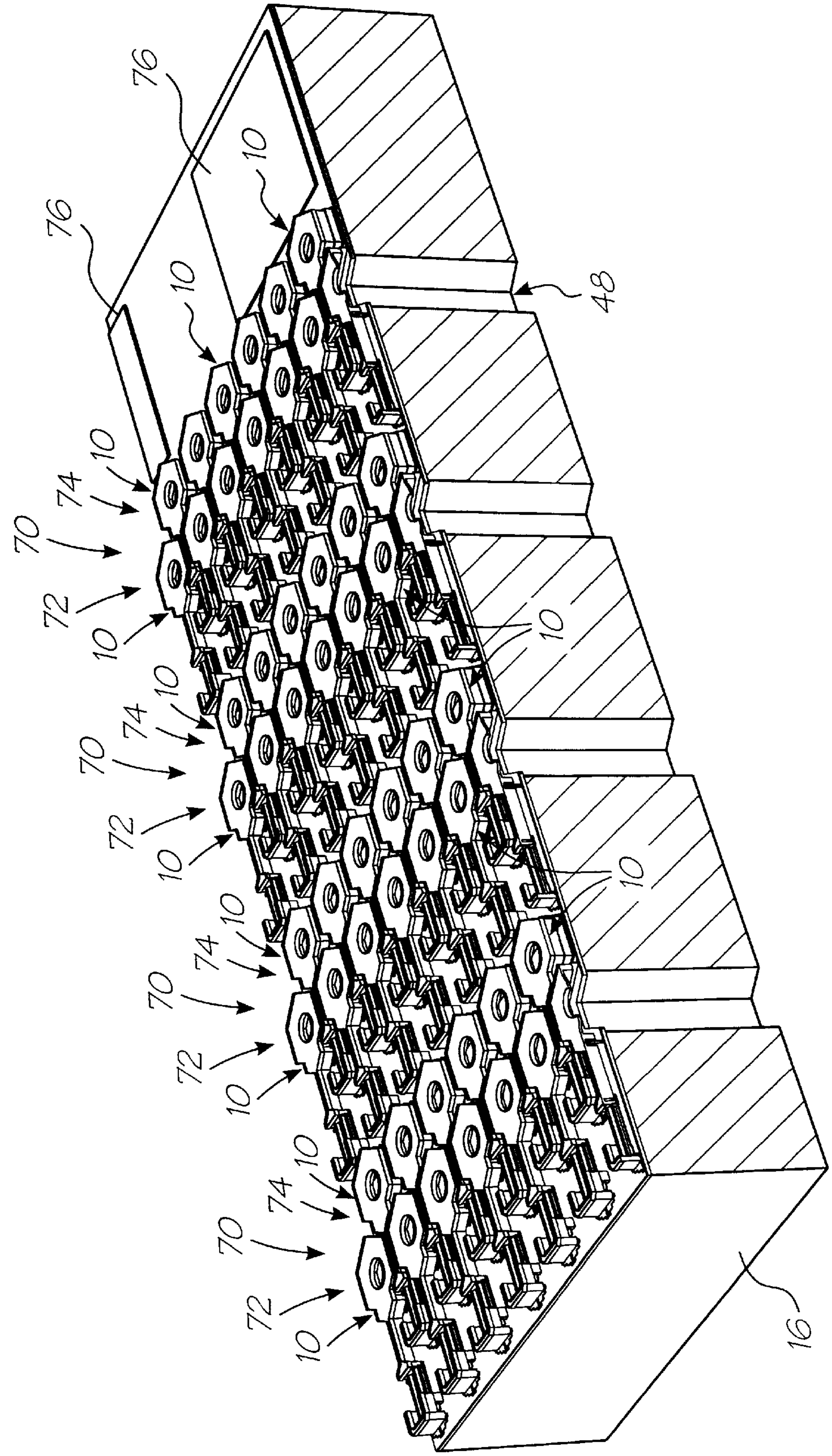
FIG. 5 shows a three-dimensional view of an array of the nozzle assemblies of FIGS. 2 to 4 constituting the printhead chip of the invention.
Figure 6:
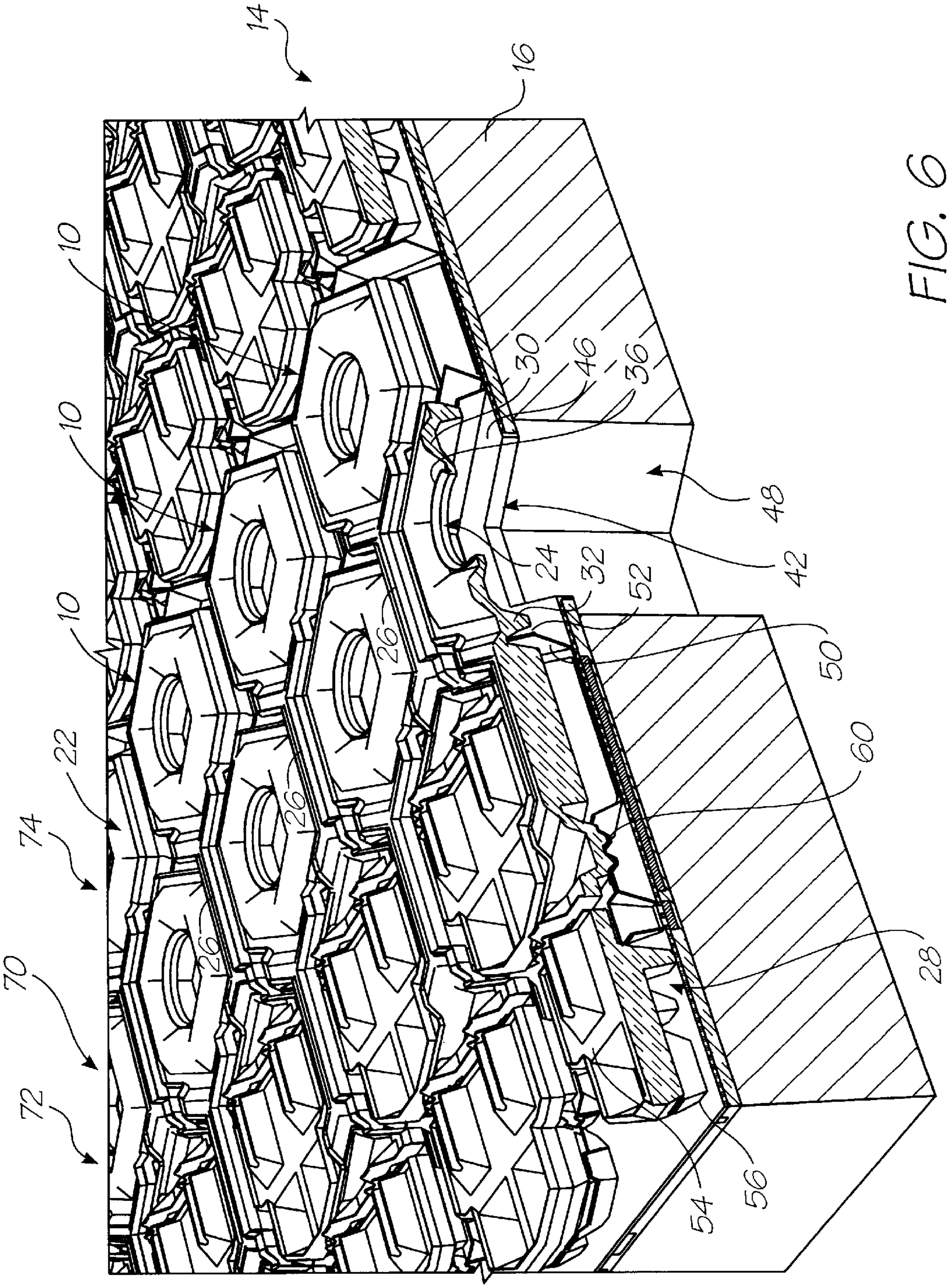
FIG. 6 shows, on an enlarged scale, part of the array of FIG. 5.

The nozzle array 14 is described in greater detail in FIGS. 5 and 6. The array 14 is for a four-color printhead.

Accordingly, the array 14 includes four groups 70 of nozzle assemblies, one for each color. Each group 70 has its nozzle assemblies 10 arranged in two rows 72 and 74. One of the groups 70 is shown in greater detail in FIG. 6 of the drawings.

To facilitate close packing of the nozzle assemblies 10 in the rows 72 and 74, the nozzle assemblies 10 in the row 74 are offset or staggered with respect to the nozzle assemblies 10 in the row 72. Also, the nozzle assemblies 10 in the row 72 are spaced apart sufficiently far from each other to enable the lever arms 26 of the nozzle assemblies 10 in the row 74 to pass between adjacent nozzle chamber walls 22 of the assemblies 10 in the row 72. It is to be noted that each nozzle assembly 10 is substantially dumbbell shaped so that the nozzle chamber walls 22 in the row 72 nest between the nozzle chamber walls 22 and the actuators 28 of adjacent nozzle assemblies 10 in the row 74.

Further, to facilitate close packing of the nozzle chamber walls 22 in the rows 72 and 74, the nozzle chamber walls 22 are substantially hexagonally shaped.

It will be appreciated by those skilled in the art that, when the crown and skirt portions 30, 32 are displaced towards the substrate 16, in use, due to the ink ejection port 24 being at a slight angle with respect to the nozzle chamber 34, ink is ejected slightly off the perpendicular. It is an advantage of the arrangement shown in FIGS. 5 and 6 of the drawings that the actuators 28 of the nozzle assemblies 10 in the rows 72 and 74 extend in the same direction to one side of the rows 72 and 74. Hence, the ink droplets ejected from the ink ejection ports 24 in the row 72 and the ink droplets ejected from the ink ejection ports 24 in the row 74 are parallel to one another resulting in an improved print quality.

Also, as shown in FIG. 5 of the drawings, the substrate 16 has bond pads 76 arranged thereon which provide the electrical connections, via the pads 56, to the actuators 28 of the nozzle assemblies 10. These electrical connections are formed via the CMOS layer (not shown).

Figure 7:
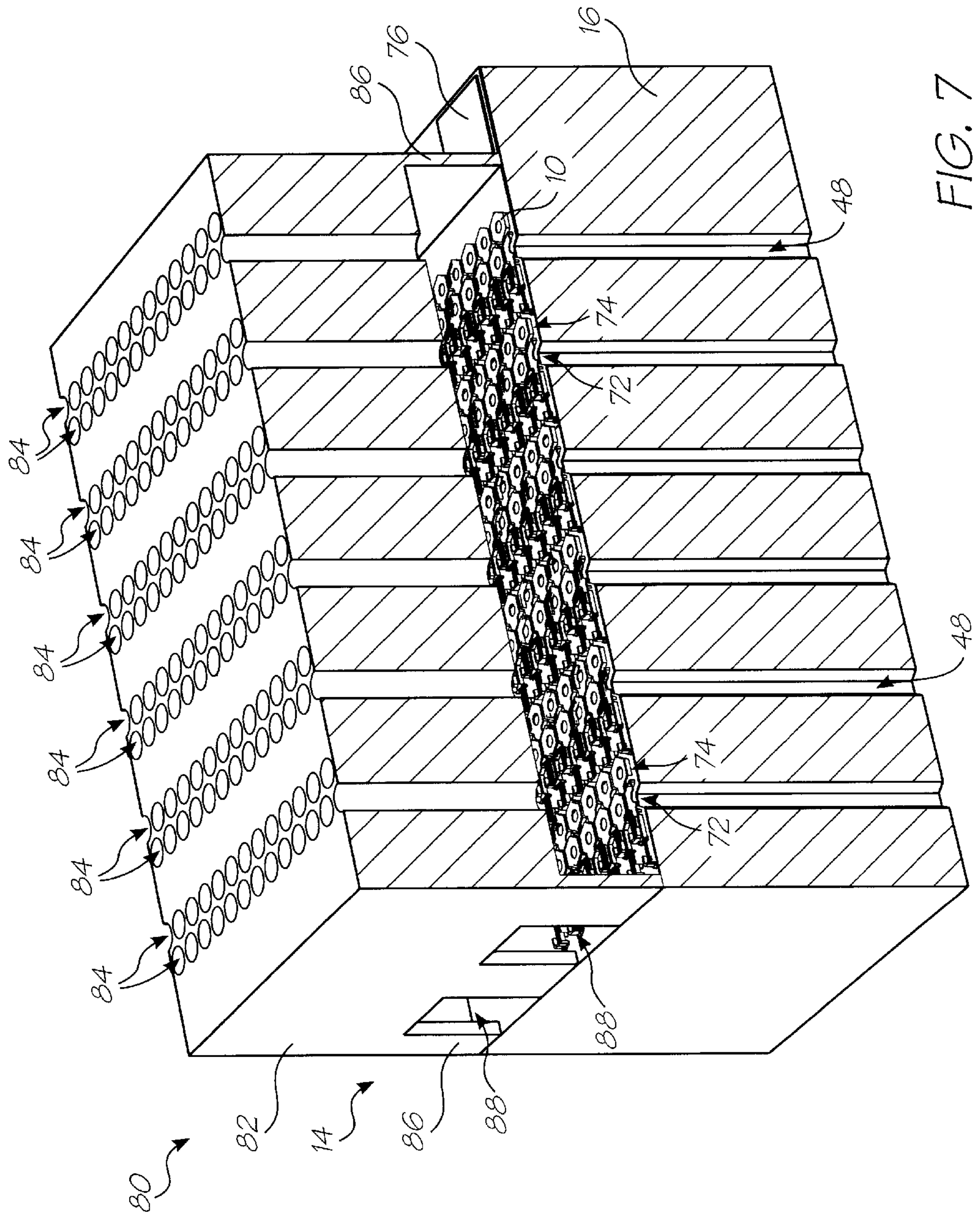
FIG. 7 shows a three dimensional view of the ink jet printhead chip with a nozzle guard positioned over the printhead chip.
Figure 9A:
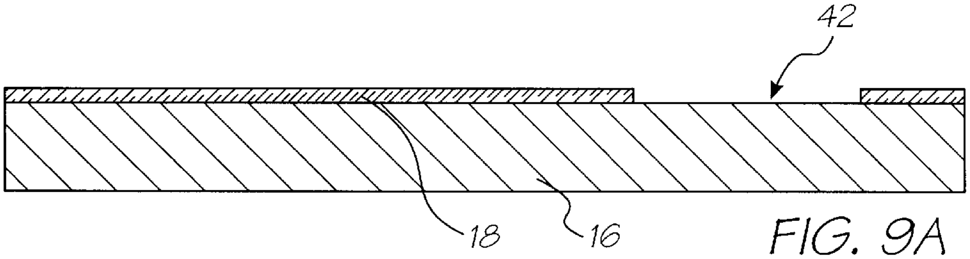
FIGS. 9*a* to 9*r* show sectional side views of the steps of FIGS. 8*a* to 8*r*.
Figure 10A:
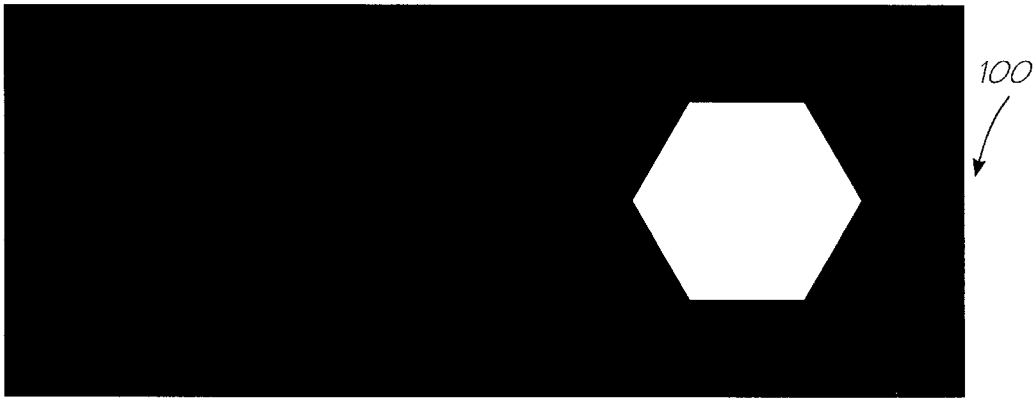
FIGS. 10*a* to 10*k* show masks used in the steps of FIGS. 8*a* to 8*r*.
Figure 9B:
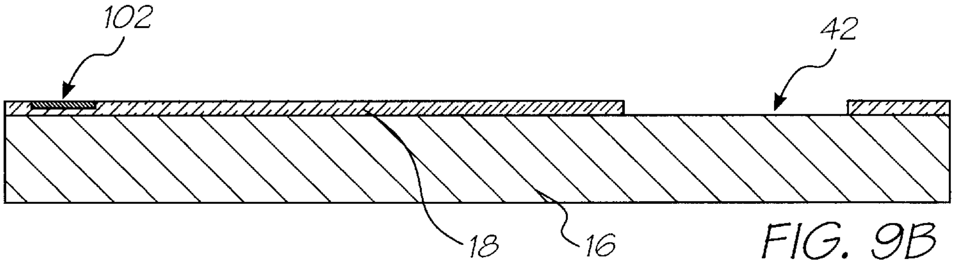
Figure 10B:
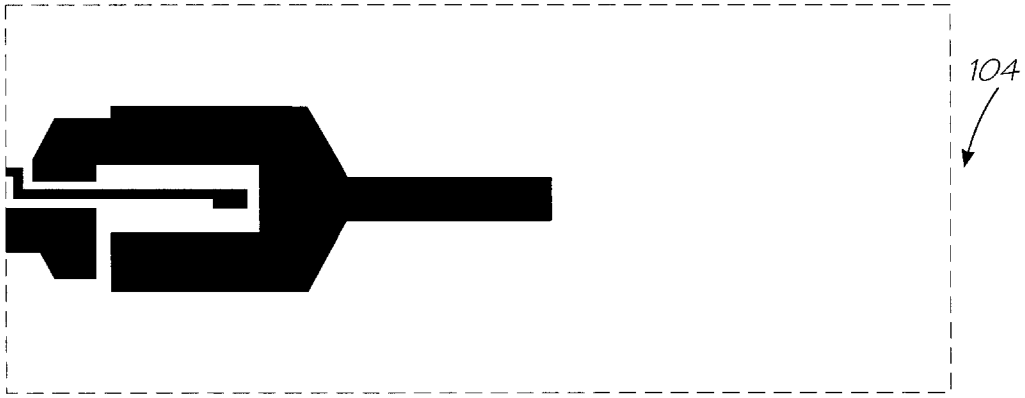
Figure 9C:
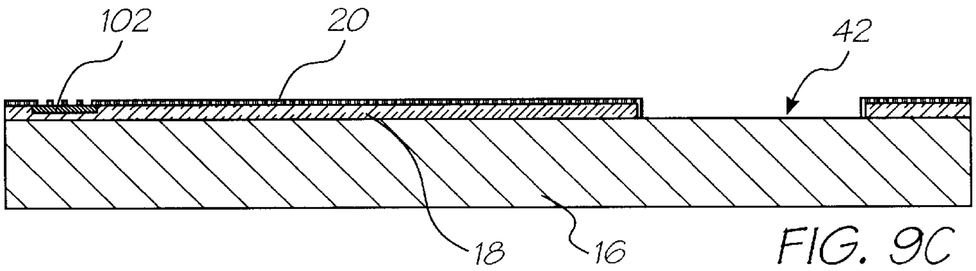
Figure 10C:
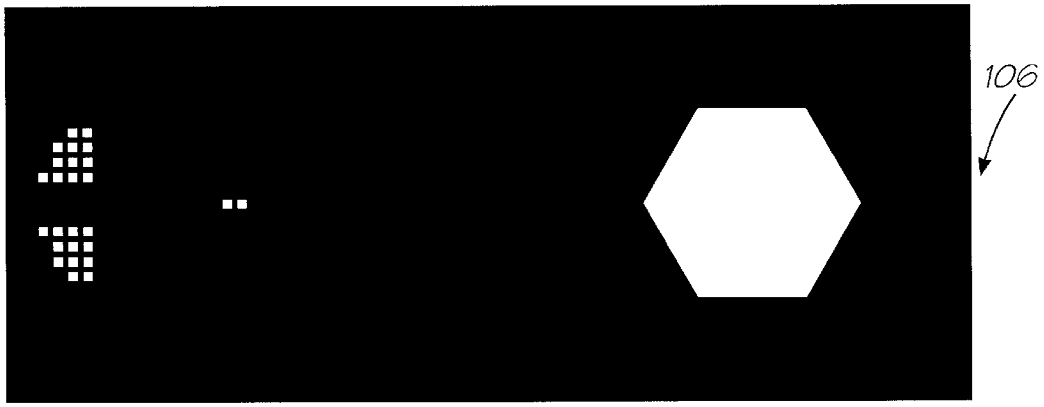
Figure 9D:
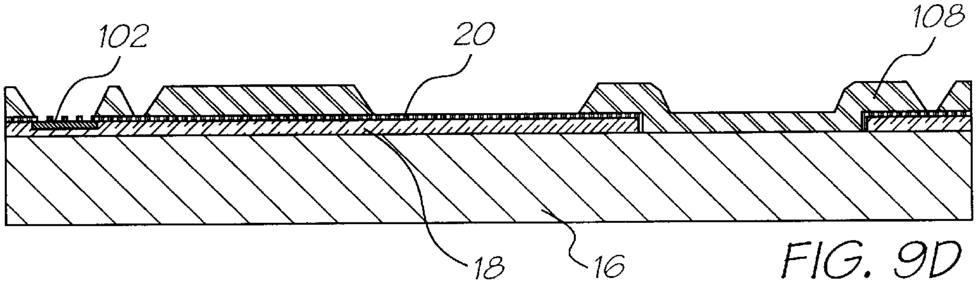
Figure 10D:
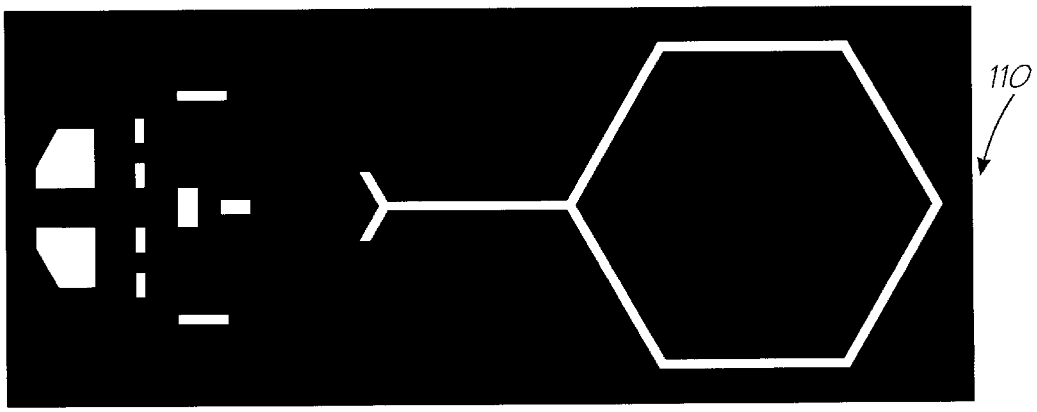

Referring to FIG. 7 of the drawings, a development of the invention is shown. With reference to the previous drawings, like reference numerals refer to like parts, unless otherwise specified.

A nozzle guard 80 is mounted on the substrate 16 of the array 14. The nozzle guard 80 includes a planar cover member 82 that defines a plurality of passages 84. The passages 84 are in register with the nozzle openings 24 of the nozzle assemblies 10 of the array 14 such that, when ink is ejected from any one of the nozzle openings 24, the ink passes through the associated passage 84 before striking the print media.

The cover member 82 is mounted in spaced relationship relative to the nozzle assemblies 10 by a support structure in the form of limbs or struts 86. One of the struts 86 has air inlet openings 88 defined therein.

The cover member 82 and the struts 86 are of a wafer substrate. Thus, the passages 84 are formed with a suitable etching process carried out on the cover member 82. The cover member 82 has a thickness of not more than approximately 300 microns. This speeds the etching process. Thus, the manufacturing cost is minimized by reducing etch time.

In use, when the printhead chip 14 is in operation, air is charged through the inlet openings 88 to be forced through the passages 84 together with ink travelling through the passages 84.

The ink is not entrained in the air since the air is charged through the passages 84 at a different velocity from that of the ink droplets 64. For example, the ink droplets 64 are ejected from the ink ejection ports 24 at a velocity of approximately 3 m/s. The air is charged through the passages 84 at a velocity of approximately 1 m/s.

The purpose of the air is to maintain the passages 84 clear of foreign particles. A danger exists that these foreign particles, such as dust particles, could fall onto the nozzle assemblies 10 adversely affecting their operation. With the provision of the air inlet openings 88 in the nozzle guard 80 this problem is, to a large extent, obviated.

Referring now to FIGS. 8 to 10 of the drawings, a process for manufacturing the printhead chip 14 is described with reference to one of the nozzle assemblies 10.

Starting with the silicon substrate or wafer 16, the dielectric layer 18 is deposited on a surface of the wafer 16. The dielectric layer 18 is in the form of approximately 1.5 microns of CVD oxide. Resist is spun on to the layer 18 and the layer 18 is exposed to mask 100 and is subsequently developed.

After being developed, the layer 18 is plasma etched down to the silicon layer 16. The resist is then stripped and the layer 18 is cleaned. This step defines the ink inlet aperture 42.

In FIG. **8*b* of the drawings, approximately 0.8 microns of aluminum 102 is deposited on the layer 18. Resist is spun on and the aluminum 102 is exposed to mask 104 and developed. The aluminum 102 is plasma etched down to the dielectric layer 18, the resist is stripped and the device is cleaned. This step provides the bond pads 56 and interconnects to the ink jet actuator 28**. This interconnect is to an NMOS drive transistor and a power plane with connections made in the CMOS layer (not shown).

Approximately 0.5 microns of PECVD nitride is deposited as the CMOS passivation layer 20. Resist is spun on and the layer 20 is exposed to mask 106 whereafter it is developed. After development, the nitride is plasma etched down to the aluminum layer 102 and the silicon layer 16 in the region of the inlet aperture 42. The resist is stripped and the device cleaned.

A layer 108 of a sacrificial material is spun on to the layer 20. The layer 108 is 6 microns of photosensitive polyimide or approximately 4 microns of high temperature resist. The layer 108 is softbaked and is then exposed to mask 110 whereafter it is developed. The layer 108 is then hardbaked at 400° C. for one hour where the layer 108 is comprised of polyimide or at greater than 300° C. where the layer 108 is high temperature resist. It is to be noted in the drawings that the pattern-dependent distortion of the polyimide layer 108 caused by shrinkage is taken into account in the design of the mask 110.

Figure 8A:
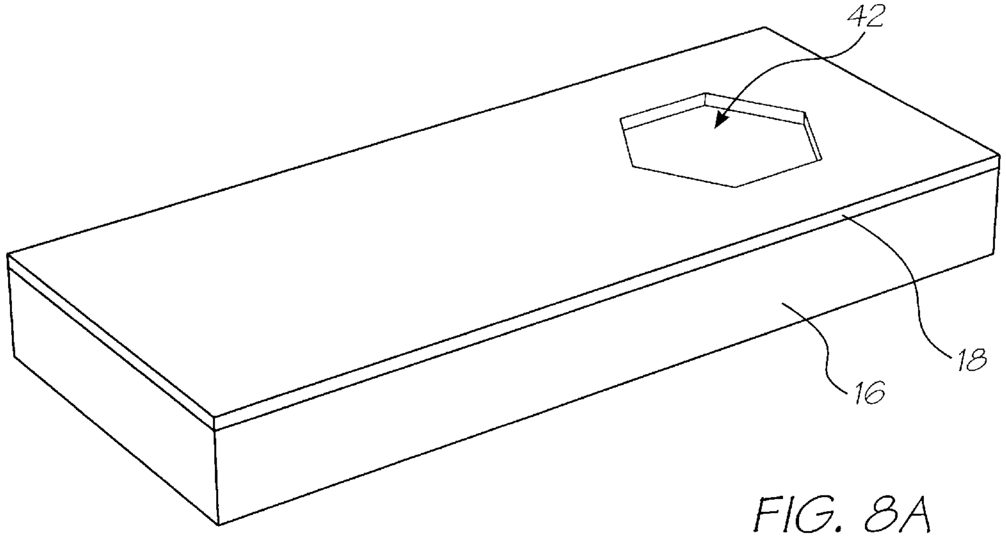
FIGS. 8*a* to 8*r* show three-dimensional views of steps in a method, of the invention, of fabricating a printhead chip, with reference to the nozzle assembly of FIG. 1.
Figure 8B:
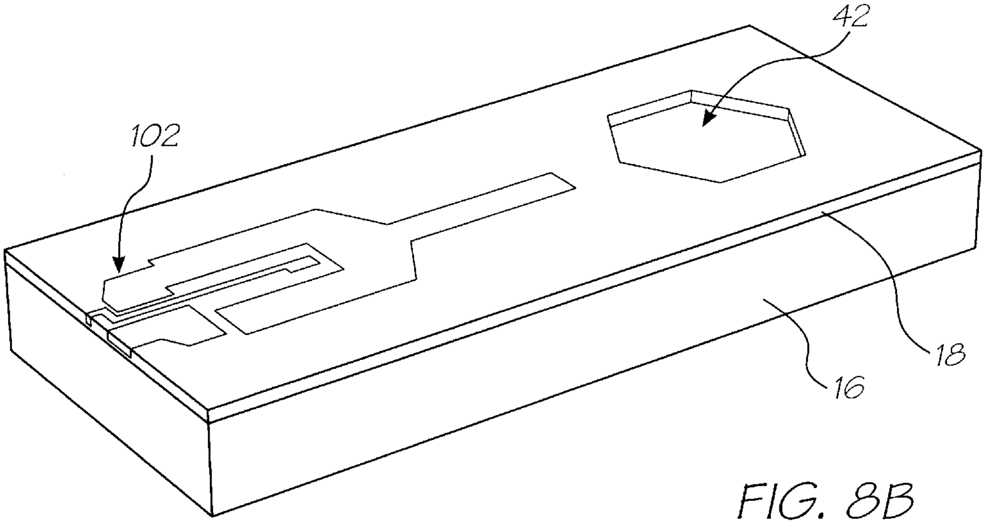
Figure 8C:
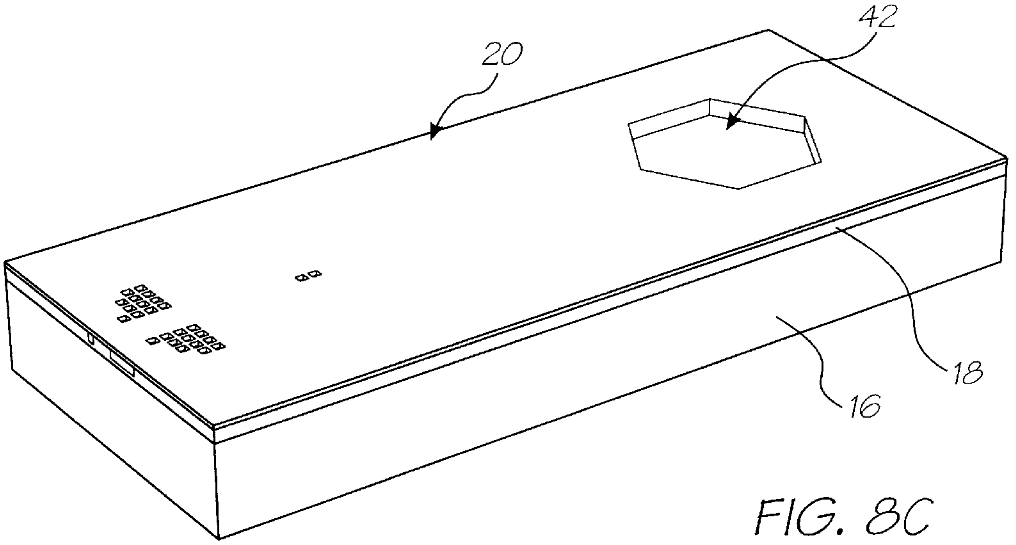
Figure 8D:
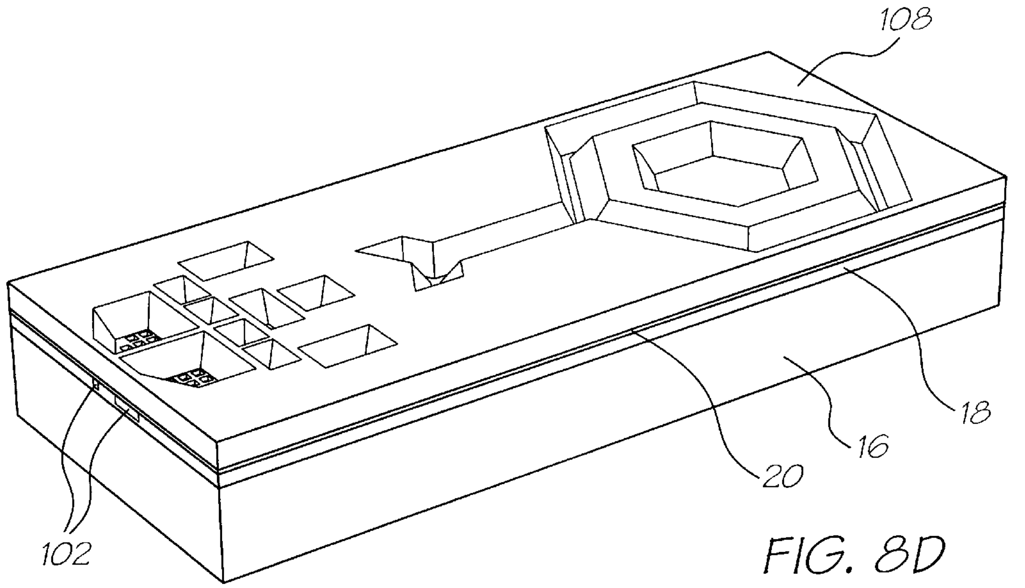
Figure 8E:
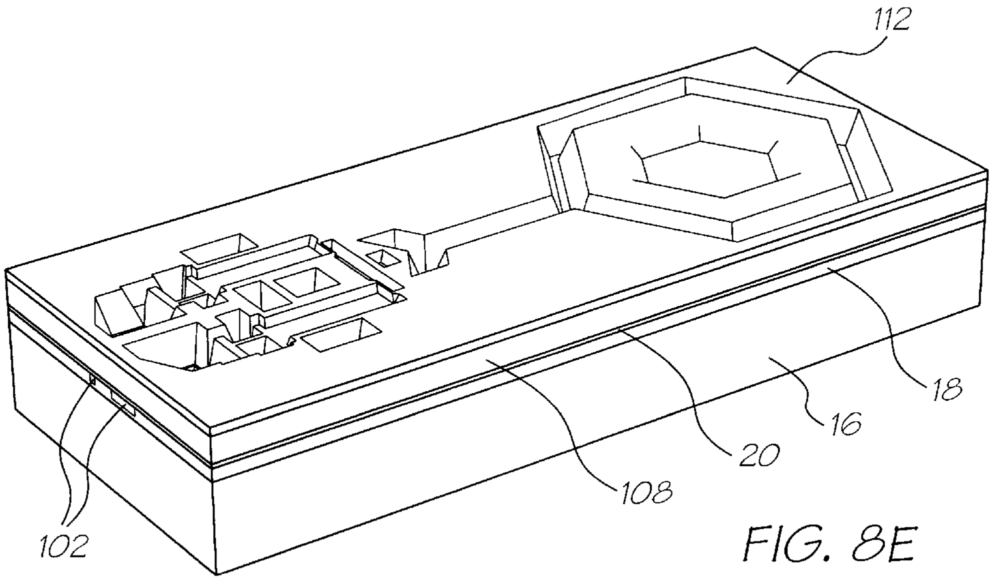
Figure 10E:
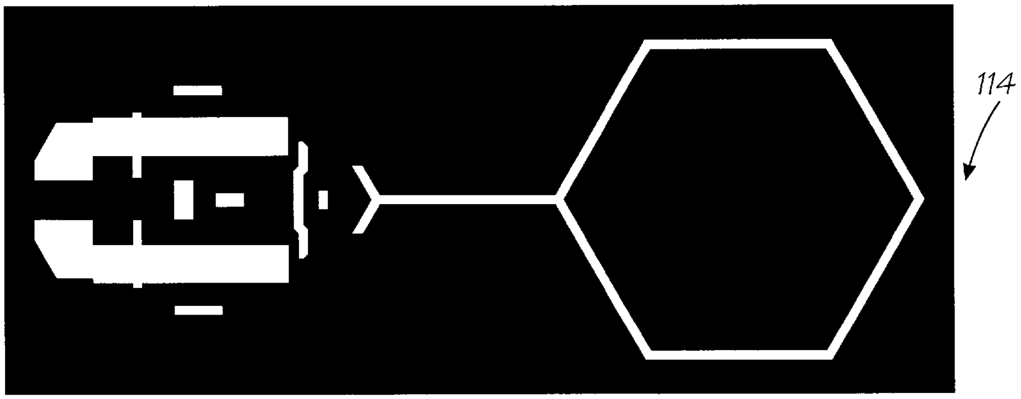
Figure 8F:
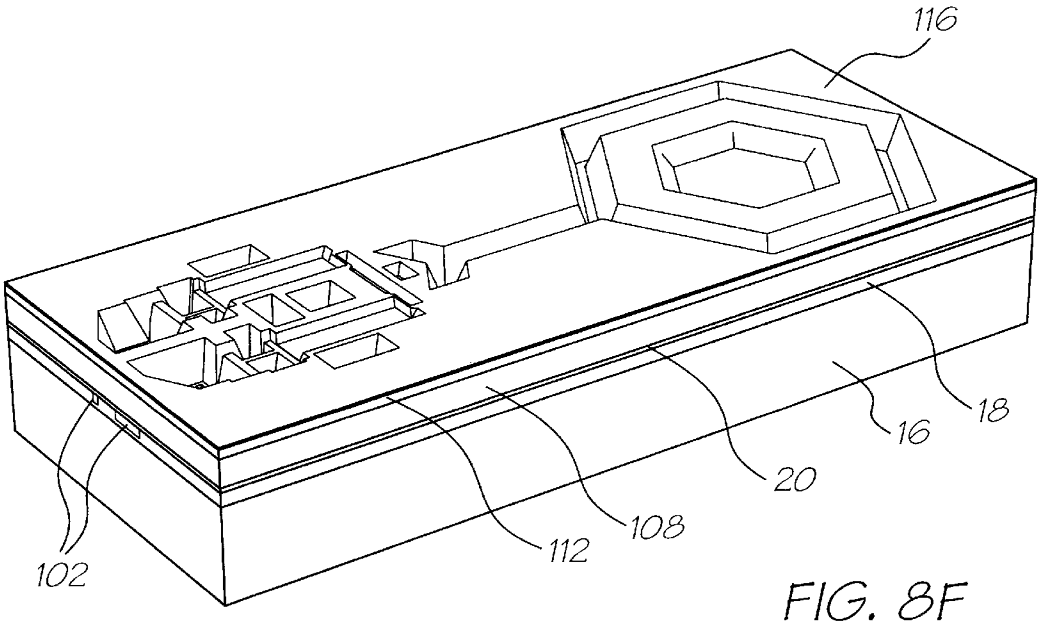
Figure 8G:
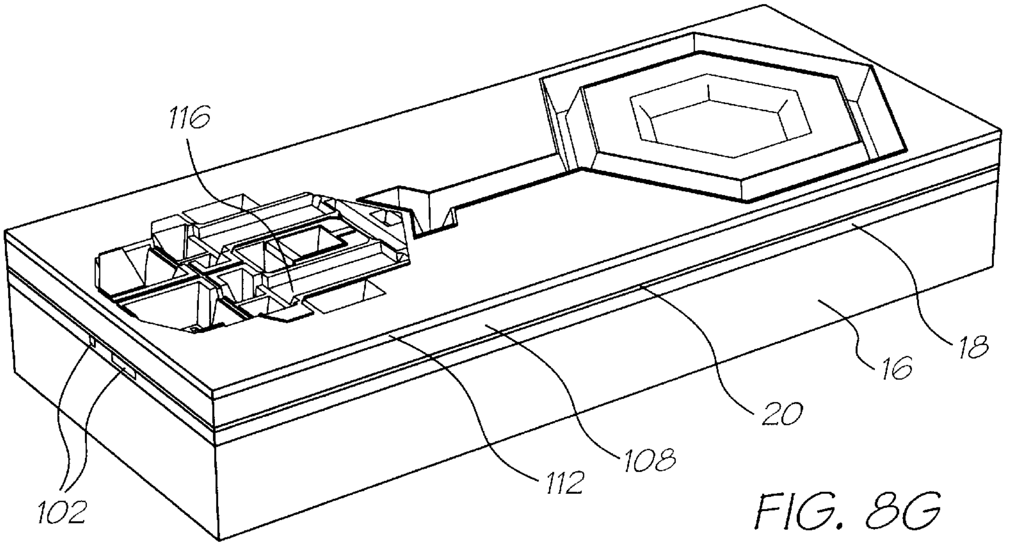
Figure 10F:
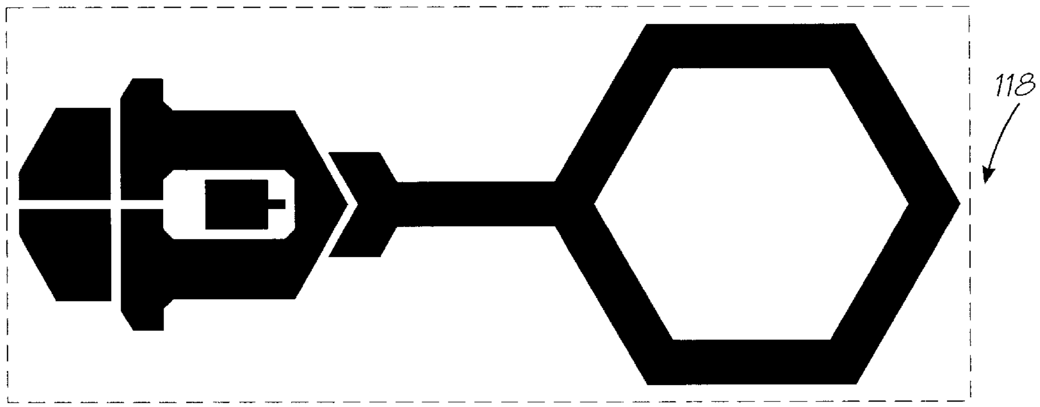
Figure 8H:
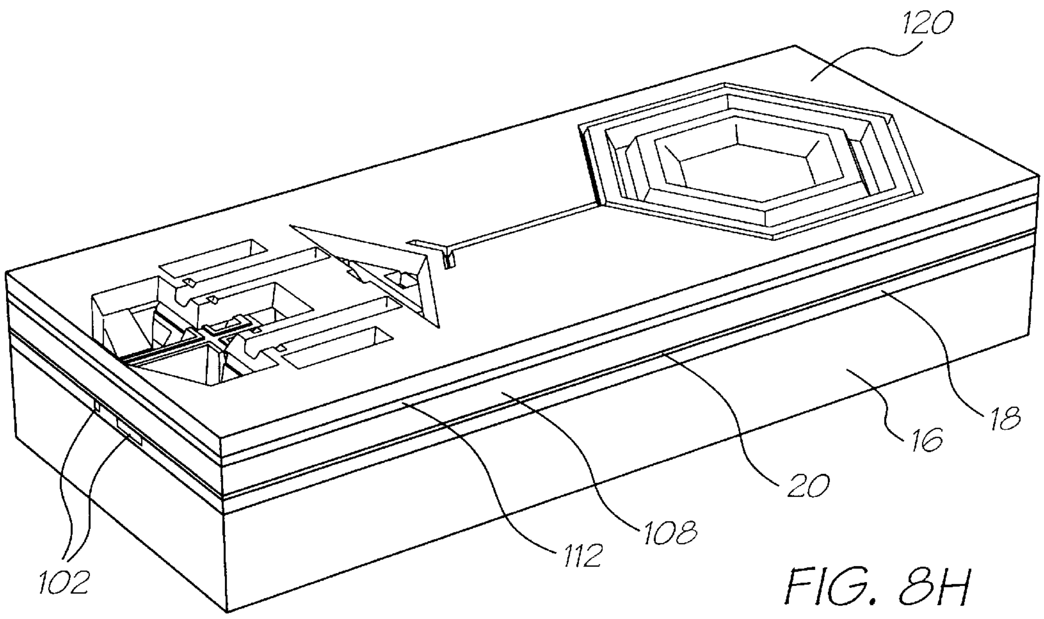
Figure 10G:
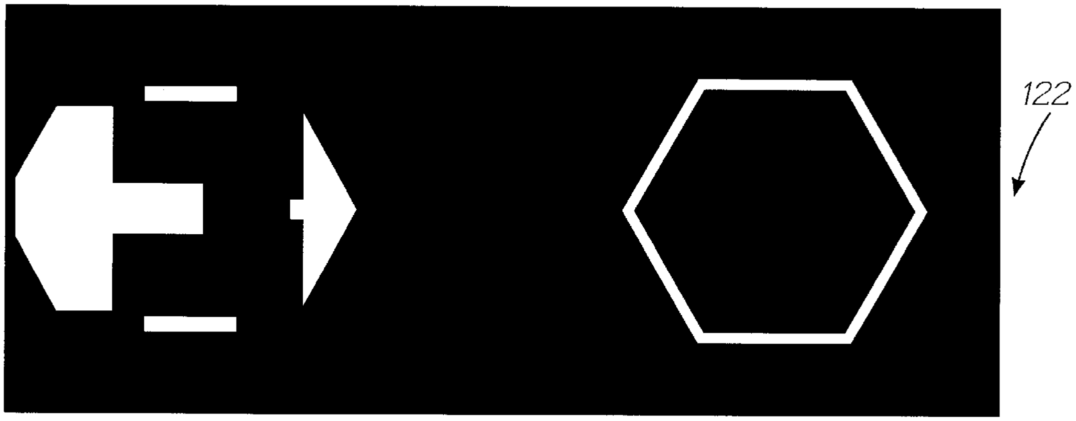
Figure 8I:
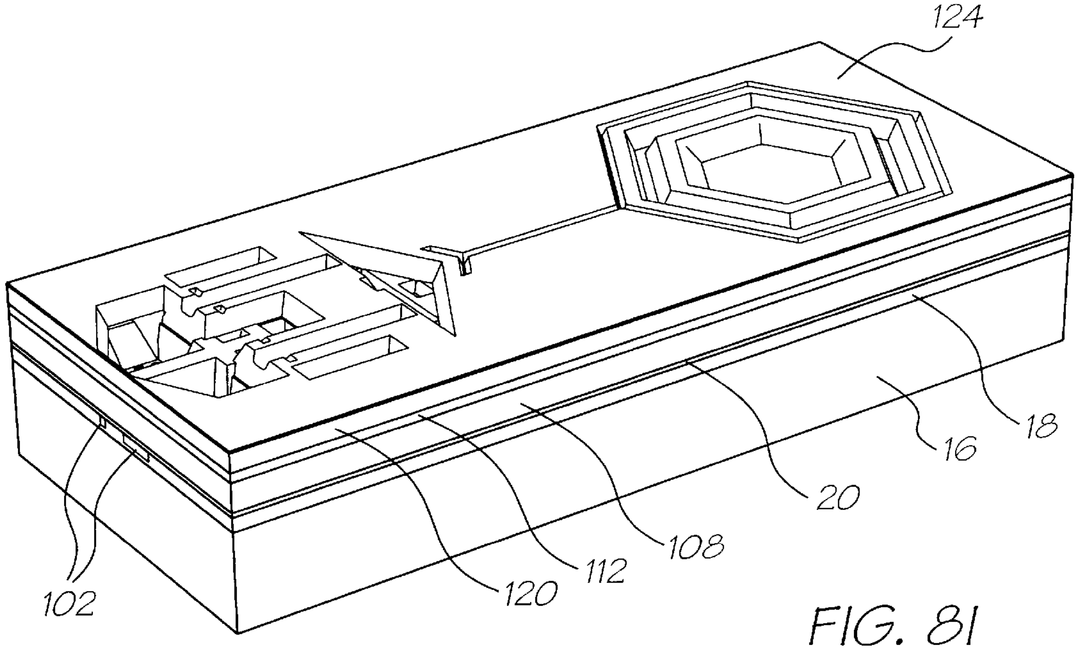
Figure 8J:
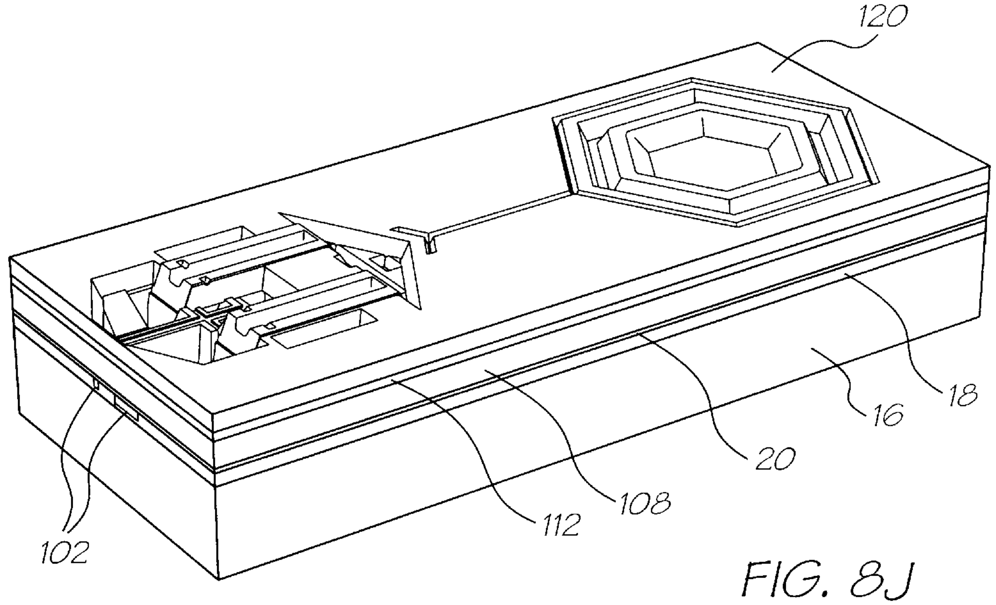
Figure 10H:
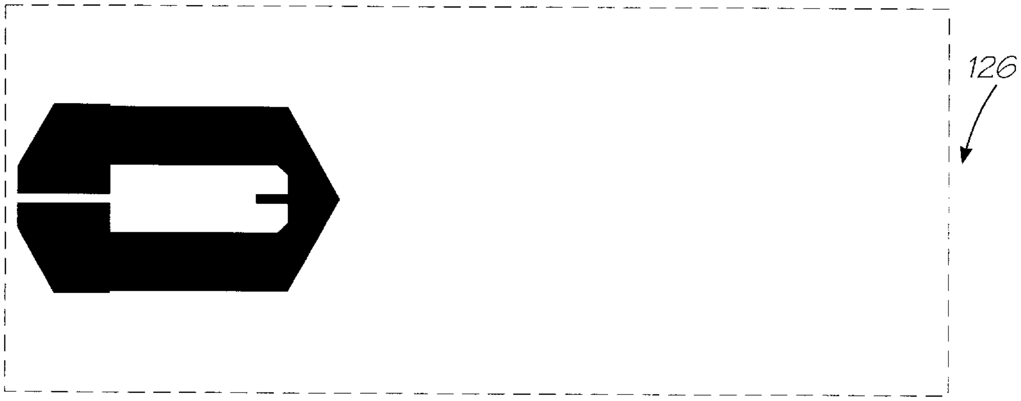
Figure 8K:
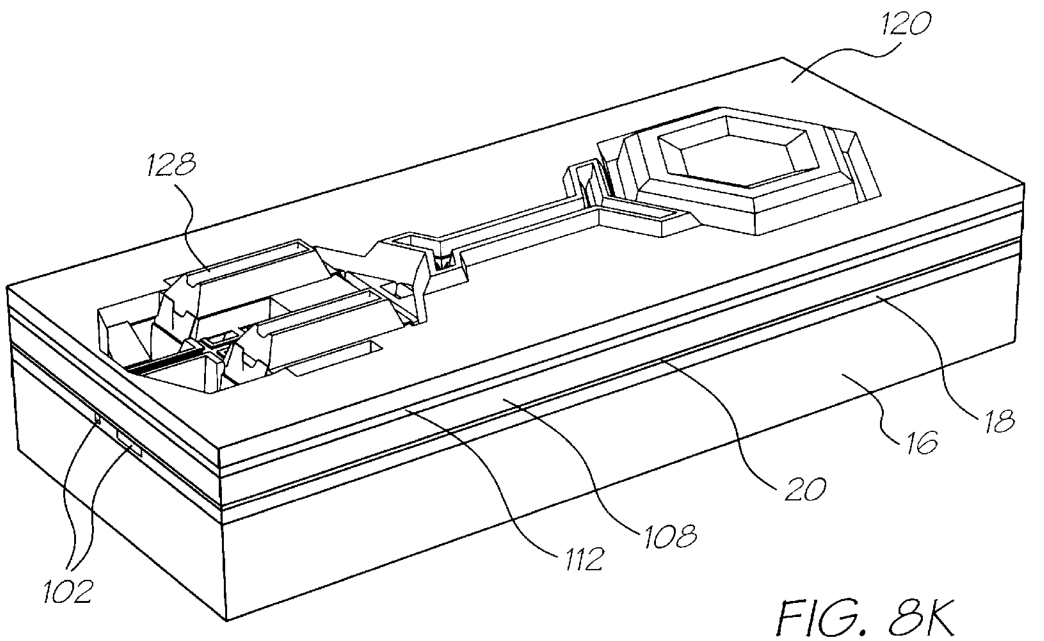

In the next step, shown in FIG. 8e of the drawings, a second sacrificial layer 112 is applied. The layer 112 is either 2 microns of photosensitive polyimide, which is spun on, or approximately 1.3 microns of high temperature resist. The layer 112 is softbaked and exposed to mask 114. After exposure to the mask 114, the layer 112 is developed. In the case of the layer 112 being polyimide, the layer 112 is hardbaked at 400° C. for approximately one hour. Where the layer 112 is resist, it is hardbaked at greater than 300° C. for approximately one hour.

A 0.2 micron multi-layer metal layer 116 is then deposited. Part of this layer 116 forms the passive beam 60 of the actuator 28.

The layer 116 is formed by sputtering 1,000 angstroms of titanium nitride (TiN) at around 300° C. followed by sputtering 50 angstroms of tantalum nitride (TaN). A further 1,000 angstroms of TiN is sputtered on followed by 50 angstroms of TaN and a further 1,000 angstroms of TiN.

Other materials, which can be used instead of TiN, are $TiB_2$, $MoSi_2$ or (Ti, Al)N.

The layer 116 is then exposed to mask 118, developed and plasma etched down to the layer 112 whereafter resist, applied to the layer 116, is wet stripped taking care not to remove the cured layers 108 or 112.

A third sacrificial layer 120 is applied by spinning on 4 microns of photosensitive polyimide or approximately 2.6 microns high temperature resist. The layer 120 is softbaked whereafter it is exposed to mask 122. The exposed layer is then developed followed by hardbaking. In the case of polyimide, the layer 120 is hardbaked at 400° C. for approximately one hour or at greater than 300° C. where the layer 120 comprises resist.

A second multi-layer metal layer 124 is applied to the layer 120. The constituents of the layer 124 are the same as the layer 116 and are applied in the same manner. It will be appreciated that both layers 116 and 124 are electrically conductive layers.

The layer 124 is exposed to mask 126 and is then developed. The layer 124 is plasma etched down to the polyimide or resist layer 120 whereafter resist applied for the layer 124 is wet stripped taking care not to remove the cured layers 108, 112 or 120. It will be noted that the remaining part of the layer 124 defines the active beam 58 of the actuator 28.

Figure 9E:
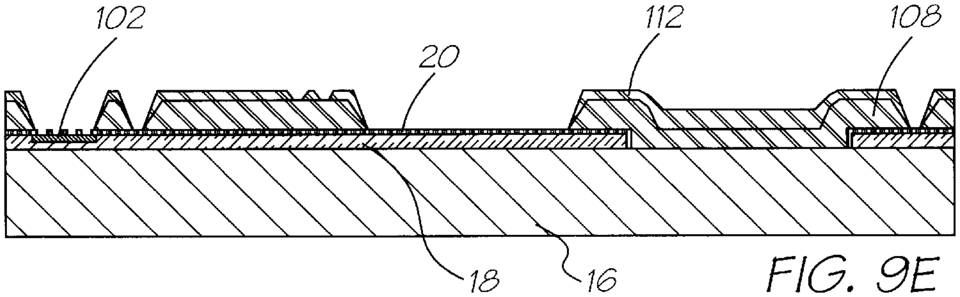
Figure 9F:
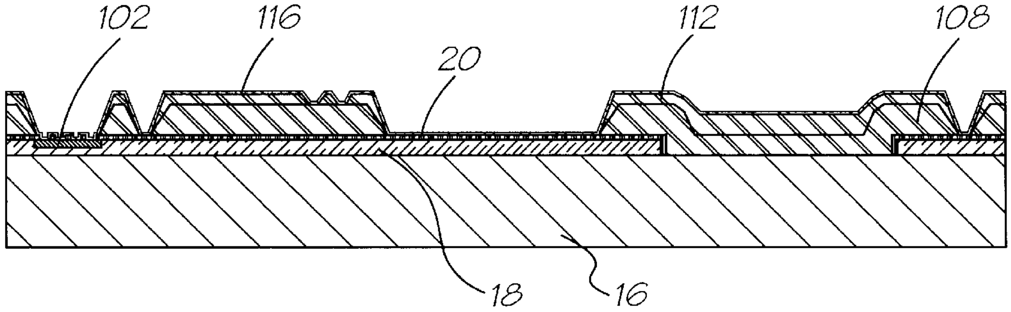
Figure 9G:
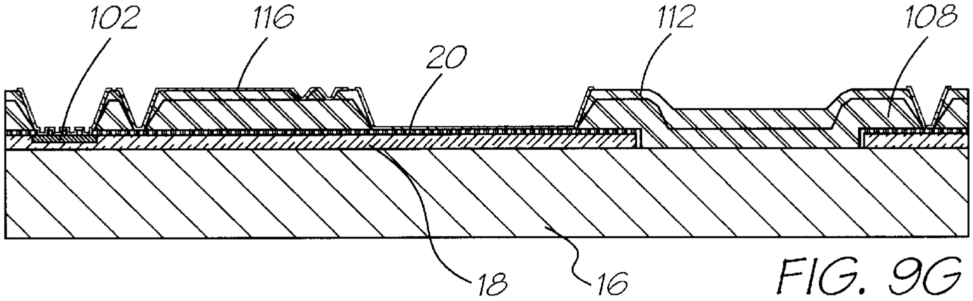
Figure 9H:
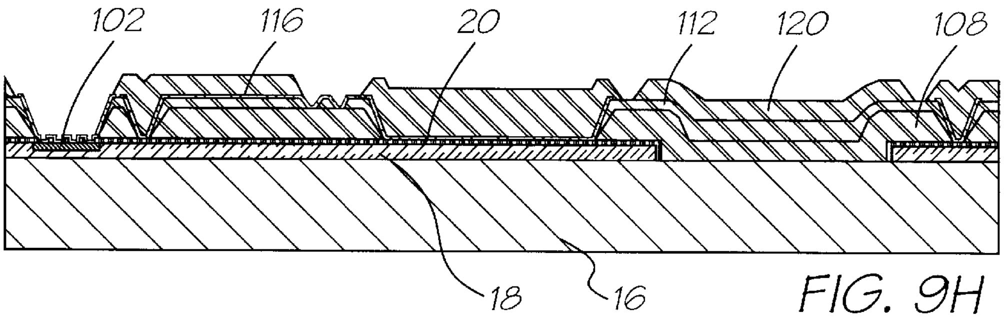
Figure 9I:
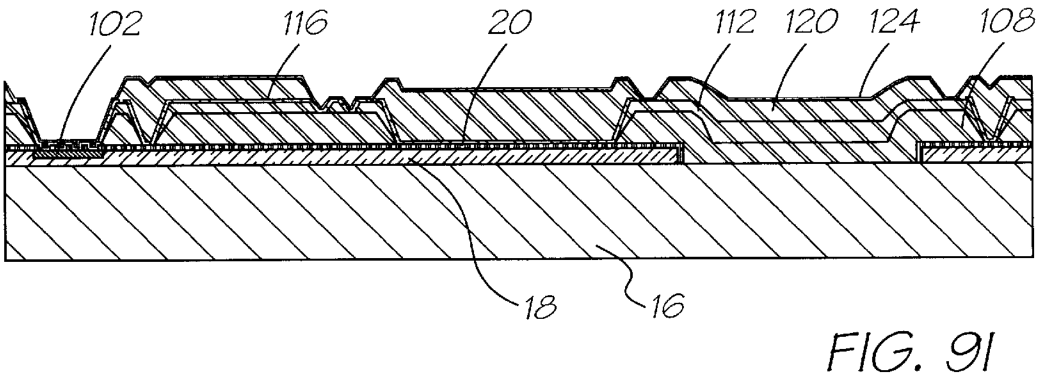
Figure 9J:
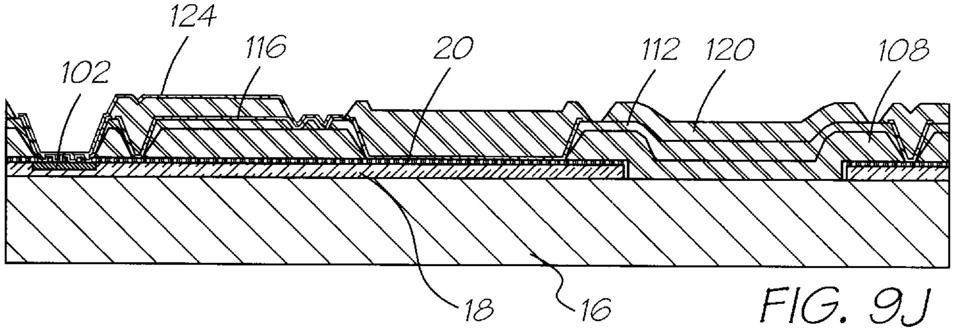
Figure 9K:
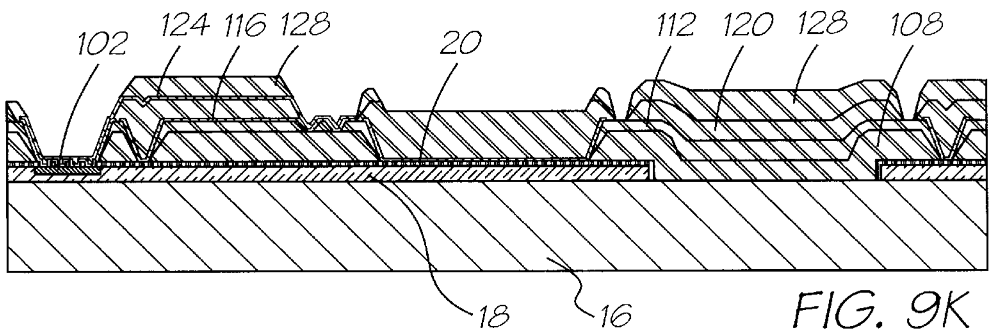
Figure 10I:
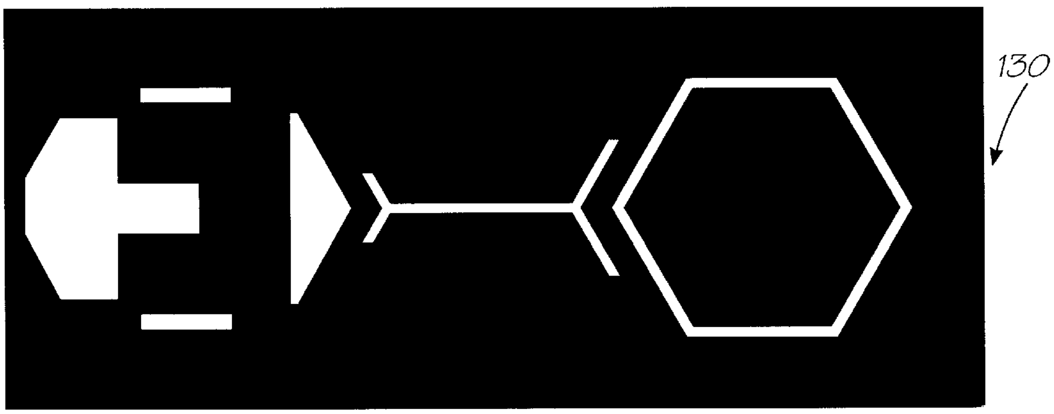
Figure 8L:
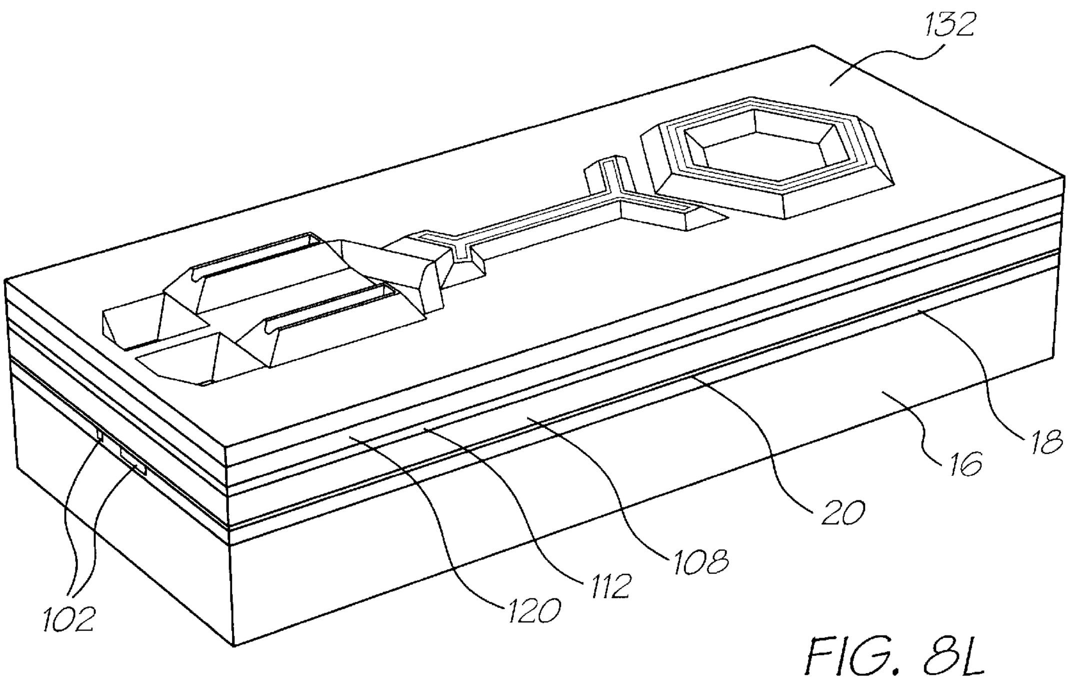
Figure 9L:
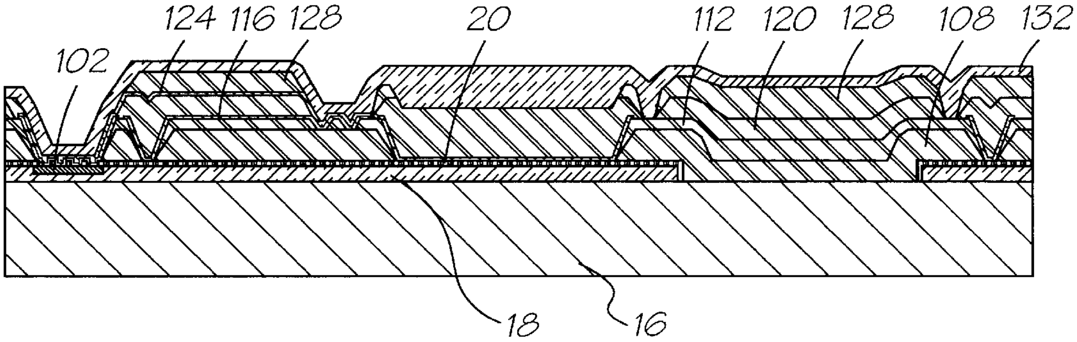
Figure 8M:
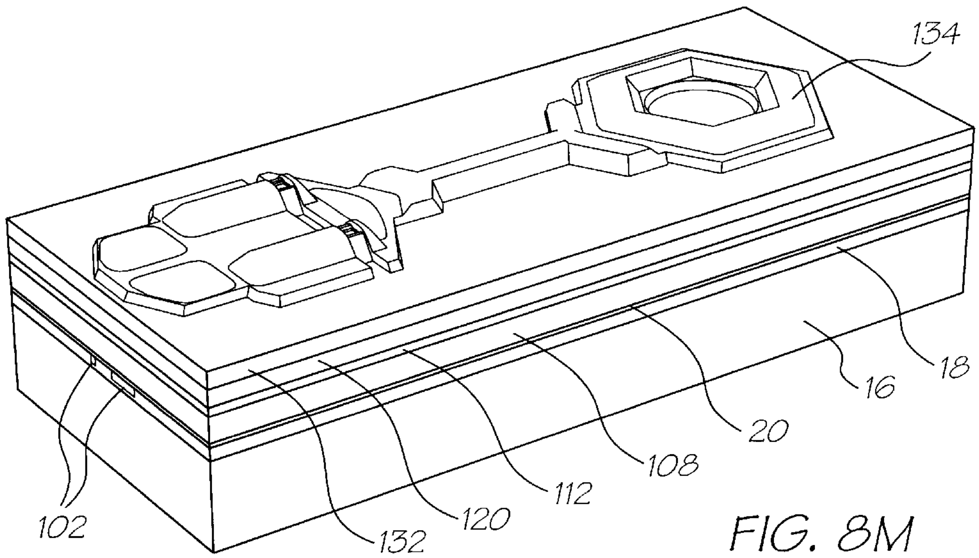
Figure 9M:
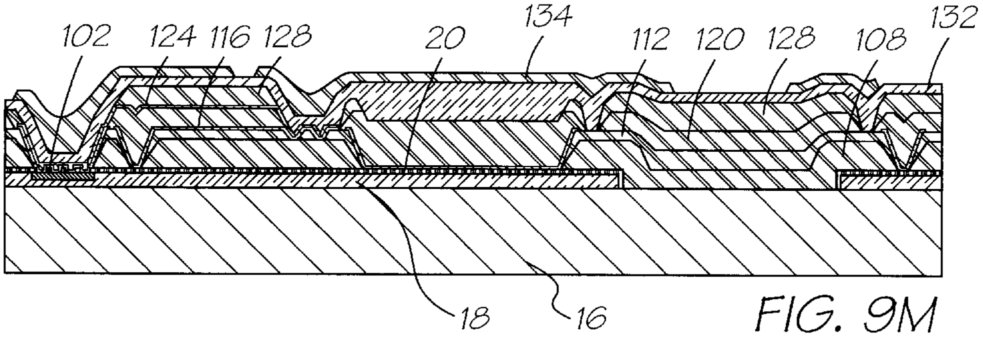
Figure 10J:
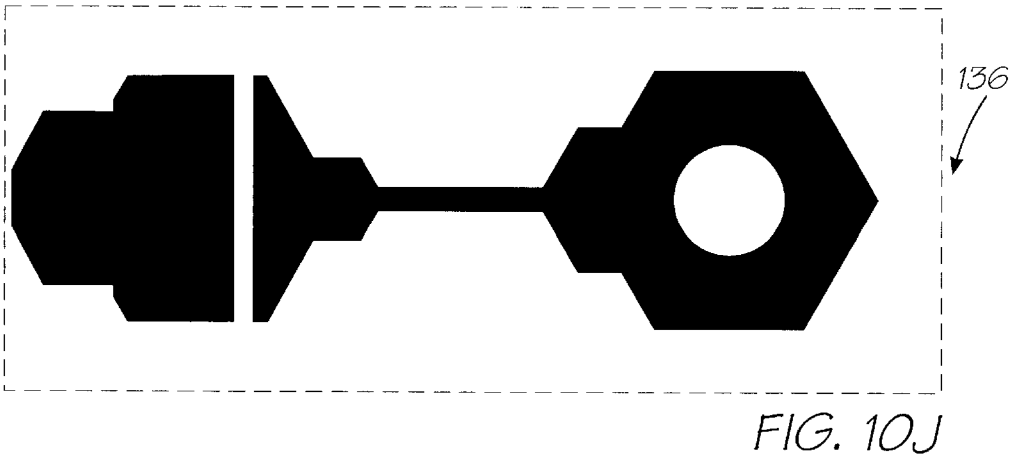
Figure 8N:
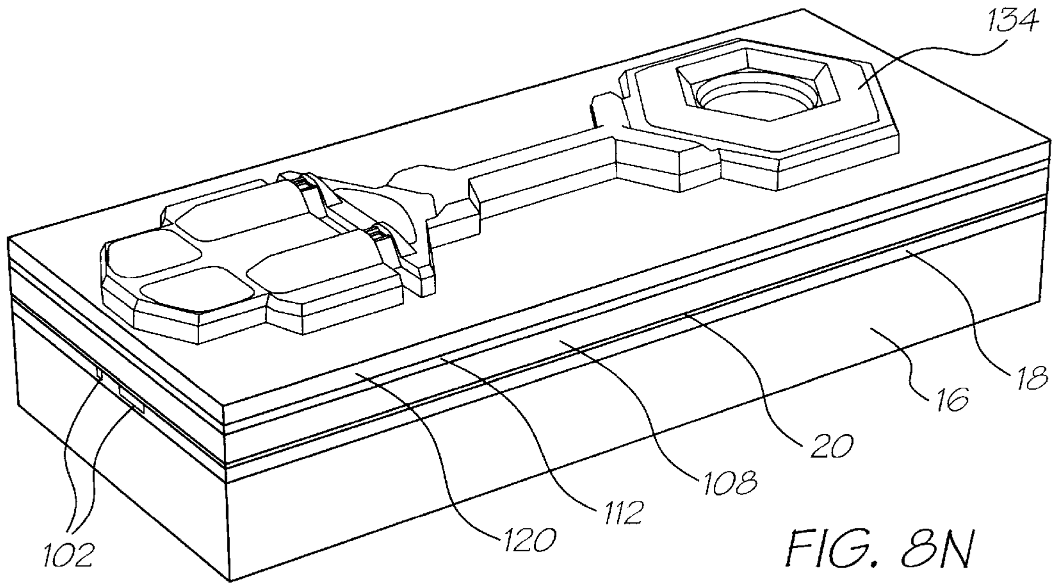
Figure 9N:
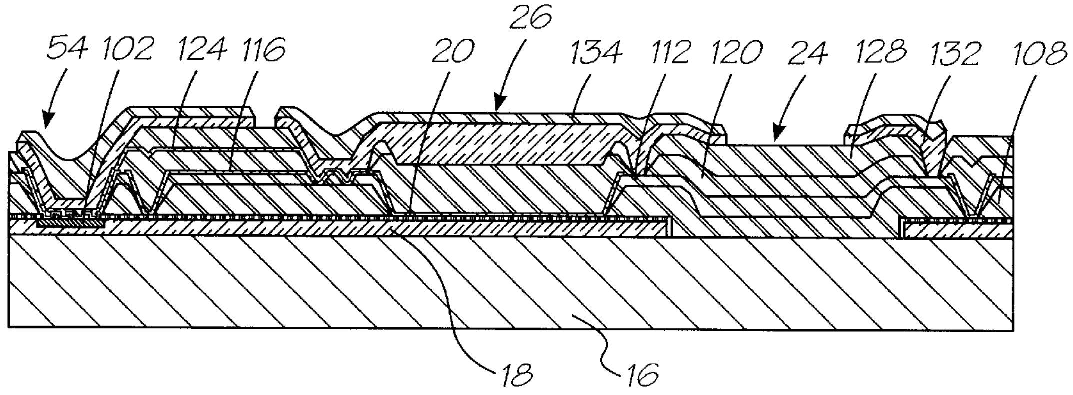
Figure 80:
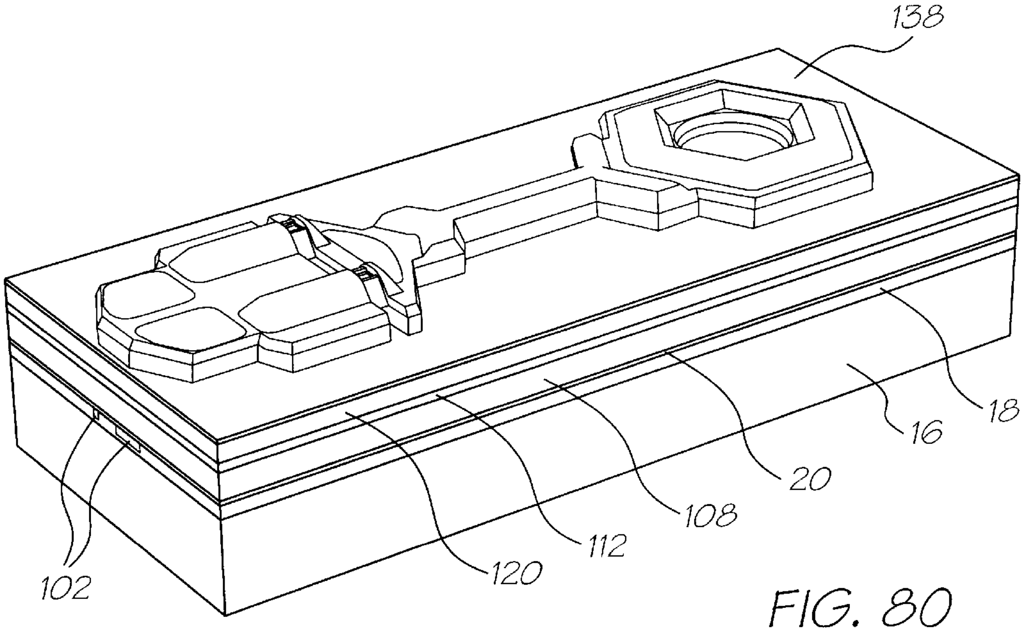
Figure 90:
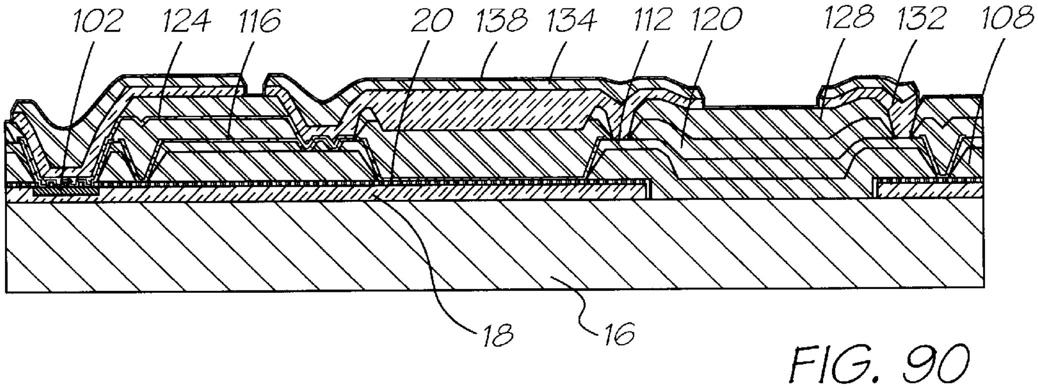
Figure 8P:
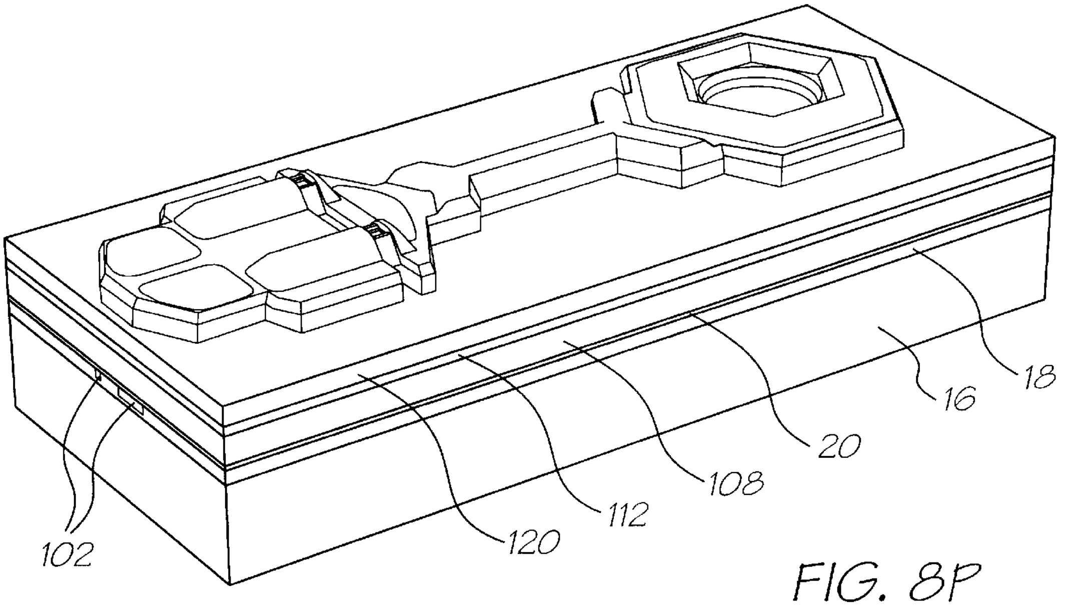
Figure 9P:
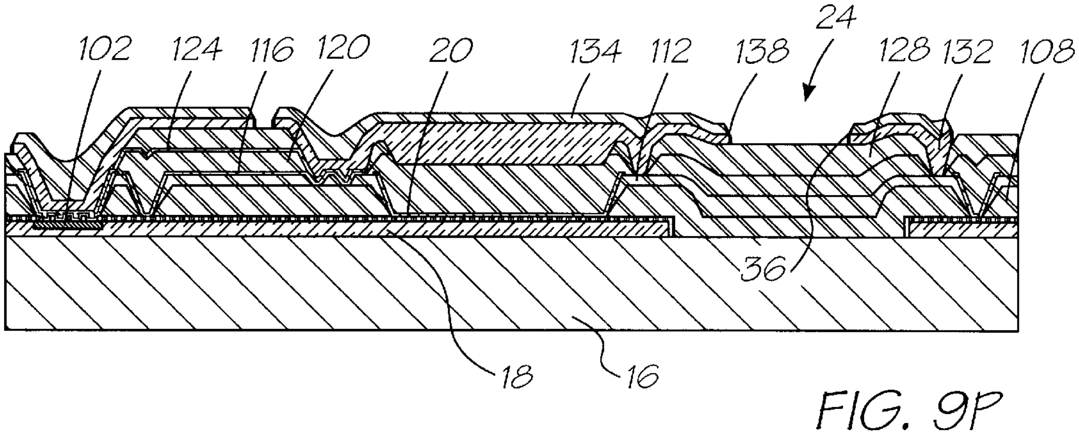
Figure 8Q:
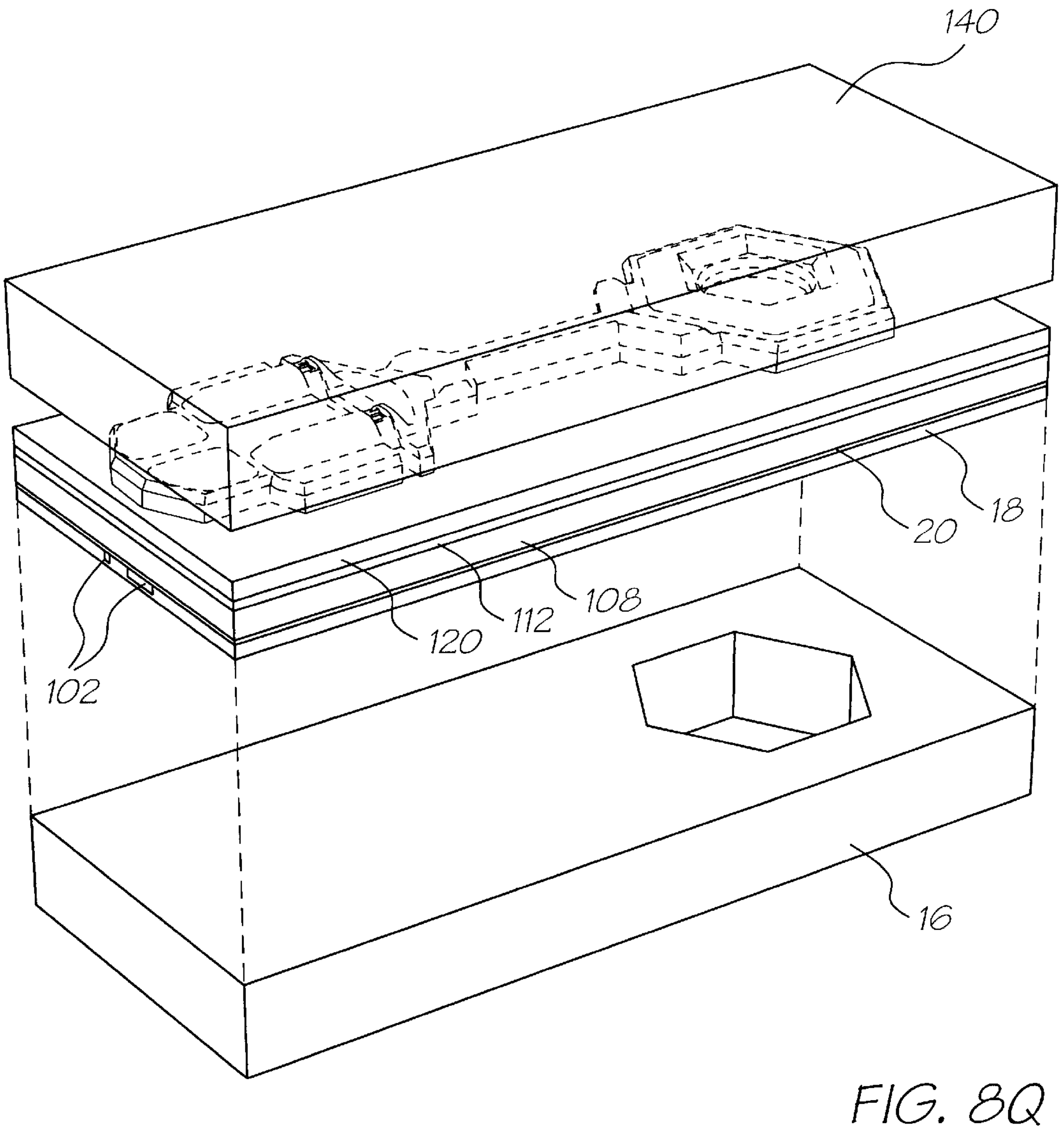
Figure 9Q:
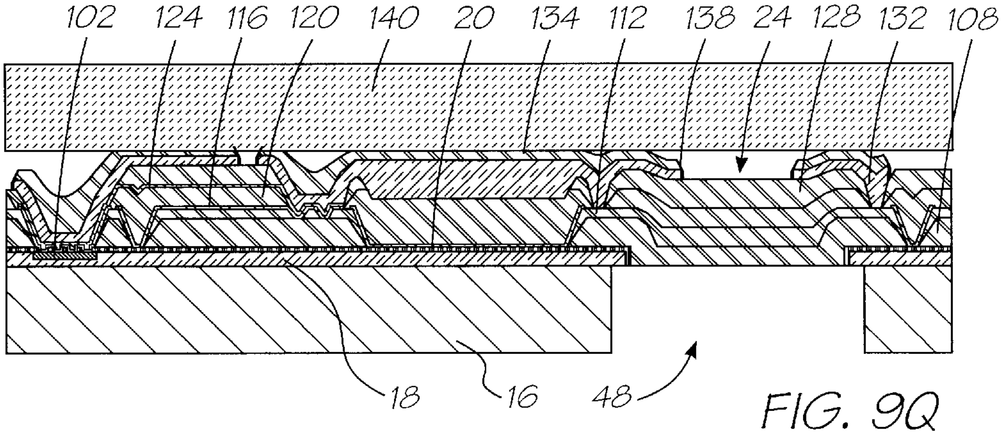
Figure 10K:
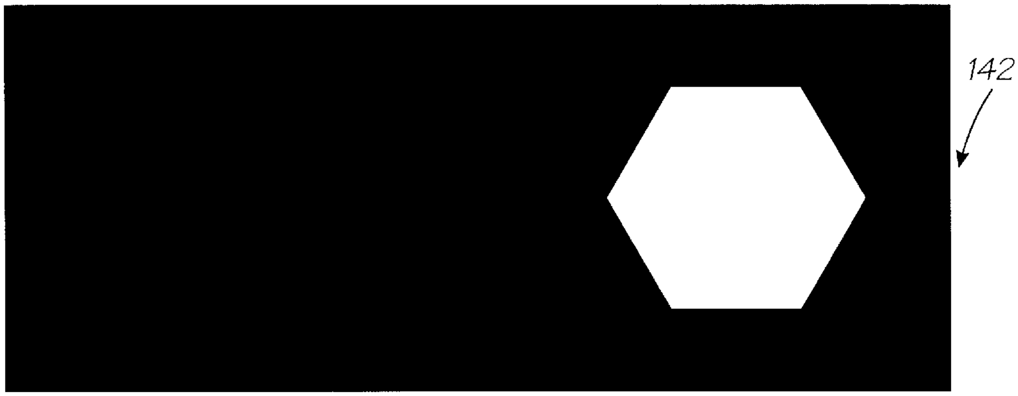
Figure 8R:
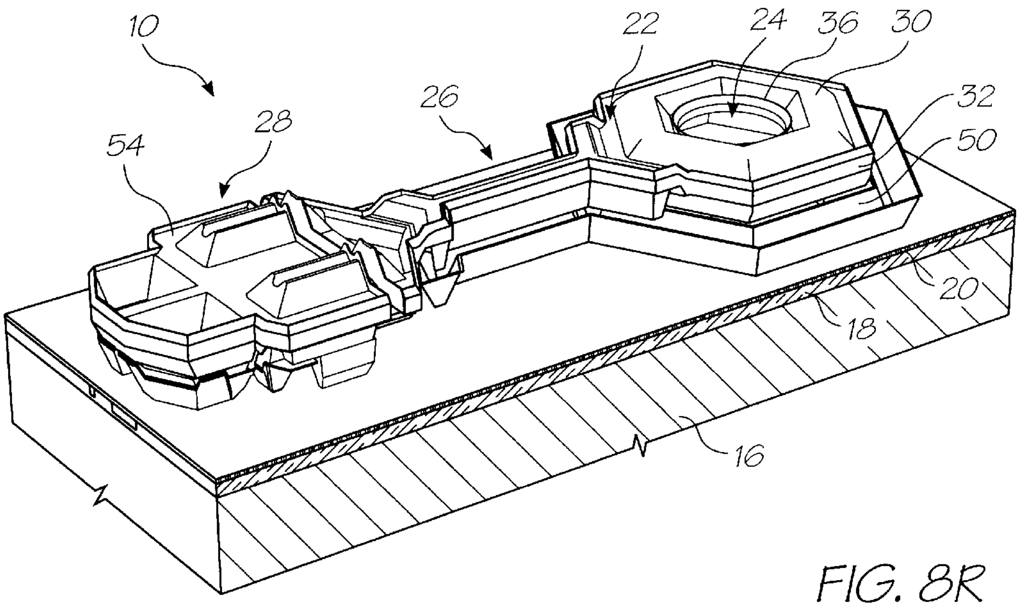
Figure 9R:
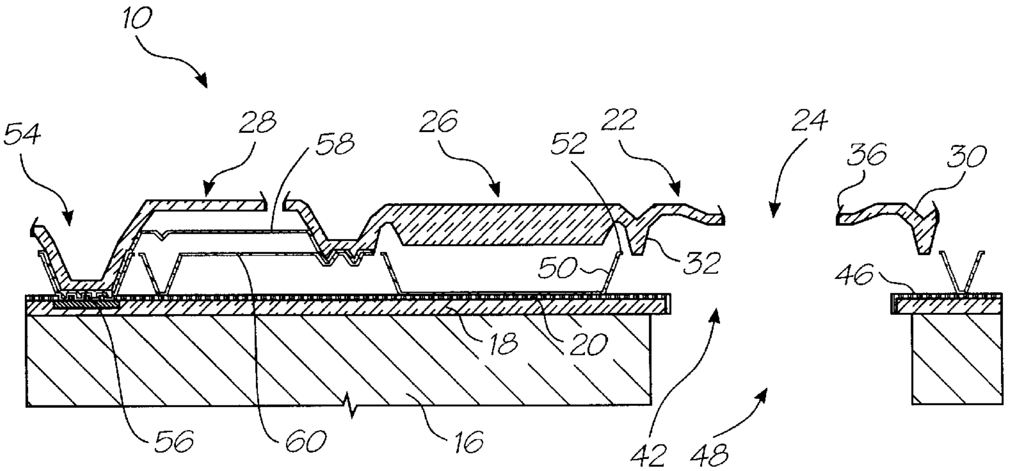

A fourth sacrificial layer 128 is applied by spinning on 4 μm of photosensitive polyimide or approximately 2.6 μm of high temperature resist. The layer 128 is softbaked, exposed to the mask 130 and is then developed to leave the island portions as shown in FIG. 9k of the drawings. The remaining portions of the layer 128 are hardbaked at 400° C. for approximately one hour in the case of polyimide or at greater than 300° C. for resist.

As shown in FIG. 81 of the drawing a high Young's modulus dielectric layer 132 is deposited. The layer 132 is constituted by approximately I micron of silicon nitride or aluminum oxide. The layer 132 is deposited at a temperature below the hardbaked temperature of the sacrificial layers 108, 112, 120, 128. The primary characteristics required for this dielectric layer 132 are a high elastic modulus, chemical inertness and good adhesion to TiN.

A fifth sacrificial layer 134 is applied by spinning on 2 microns of photosensitive polyimide or approximately 1.3 microns of high temperature resist. The layer 134 is softbaked, exposed to mask 136 and developed. The remaining portion of the layer 134 is then hardbaked at 400° C. for one hour in the case of the polyimide or at greater than 300° C. for the resist.

The dielectric layer 132 is plasma etched down to the sacrificial layer 128 taking care not to remove any of the sacrificial layer 134.

This step defines the nozzle opening 24, the lever arm 26 and the anchor 54 of the nozzle assembly 10.

A high Young's modulus dielectric layer 138 is deposited. This layer 138 is formed by depositing 0.2 micron of silicon nitride or aluminum nitride at a temperature below the hardbaked temperature of the sacrificial layers 108, 112, 120 and 128.

Then, as shown in FIG. *8p* of the drawings, the layer 138 is anisotropically plasma etched to a depth of 0.35 microns. This etch is intended to clear the dielectric from all of the surface except the side walls of the dielectric layer 132 and the sacrificial layer 134. This step creates the nozzle rim 36 around the nozzle opening 24, which "pins" the meniscus 38 of ink, as described above.

An ultraviolet (UV) release tape 140 is applied. 4 Microns of resist is spun on to a rear of the silicon wafer 16. The wafer 16 is exposed to a mask 142 to back etch the wafer 16 to define the ink inlet channel 48. The resist is then stripped from the wafer 16.

Figure 11A:
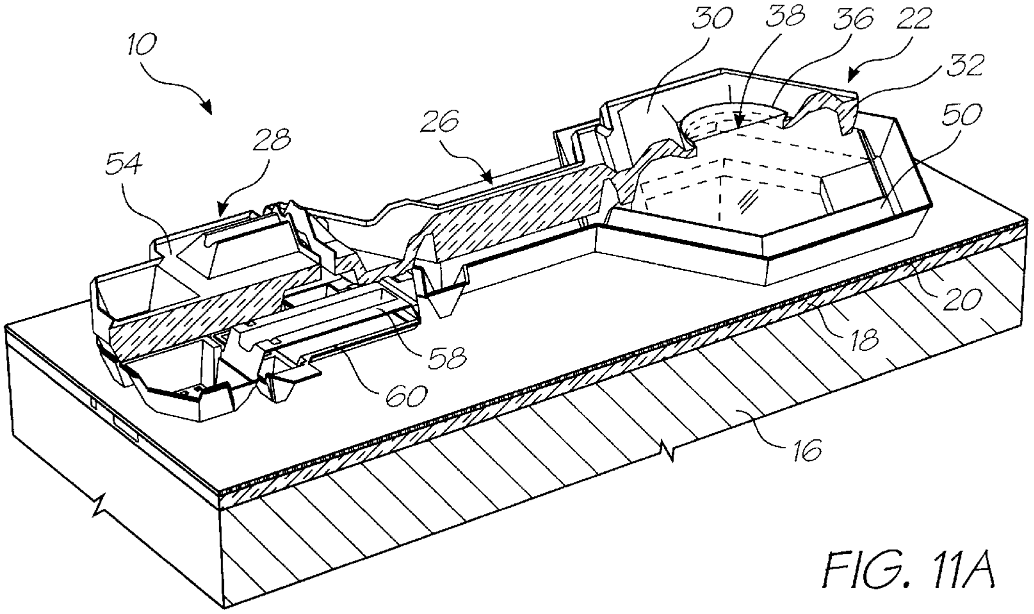
FIGS. 11*a* to 11*c* show three-dimensional views of an operation of the nozzle assembly of FIG. 1.
Figure 12A:
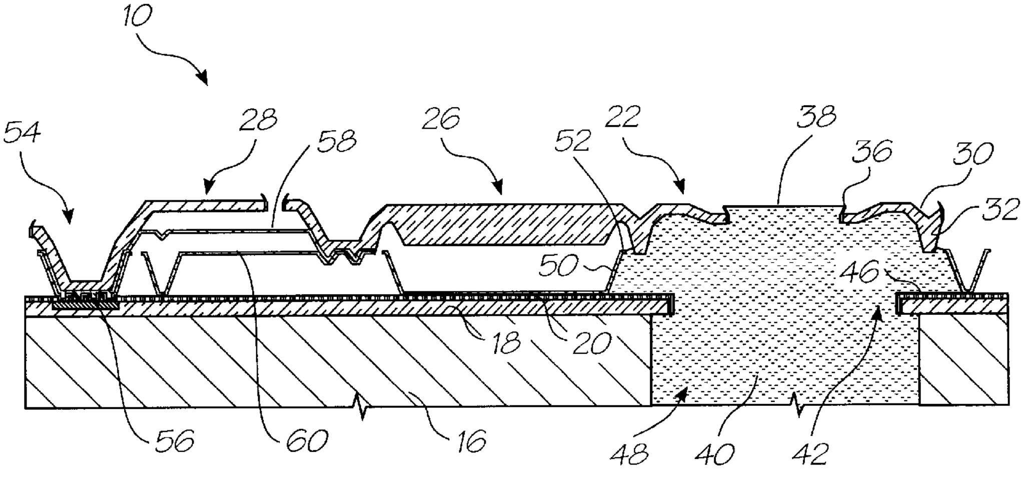
FIGS. 12*a* to 12*c* show sectional side views of an operation of the nozzle assembly of FIG. 1.
Figure 11B:
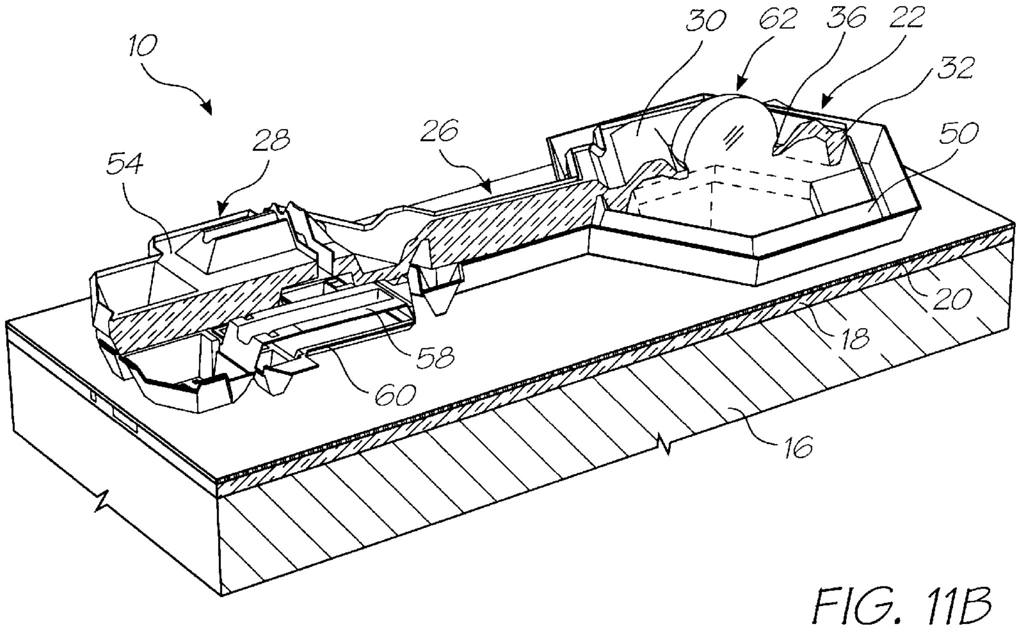
Figure 12B:
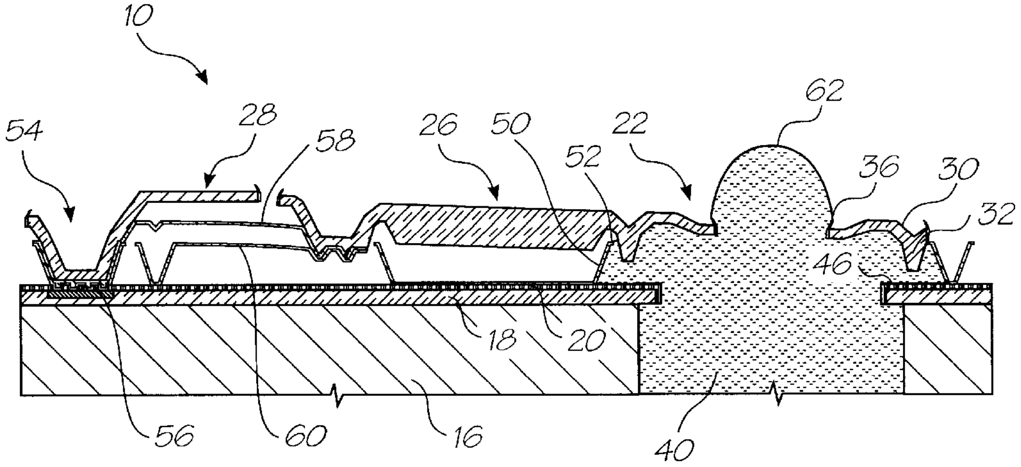
Figure 11C:
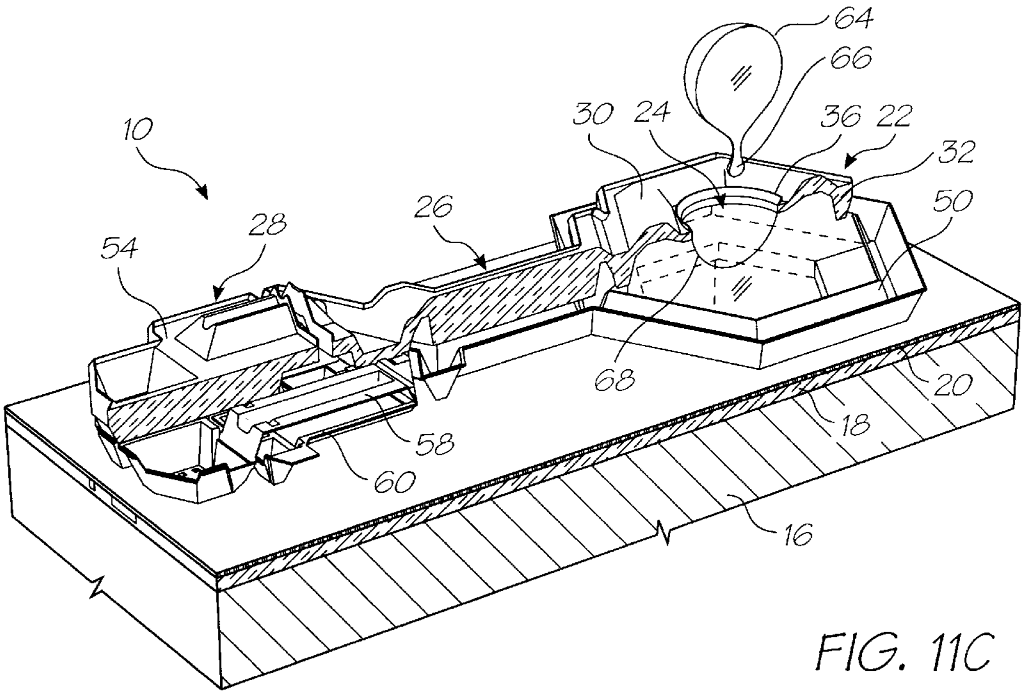
Figure 12C:
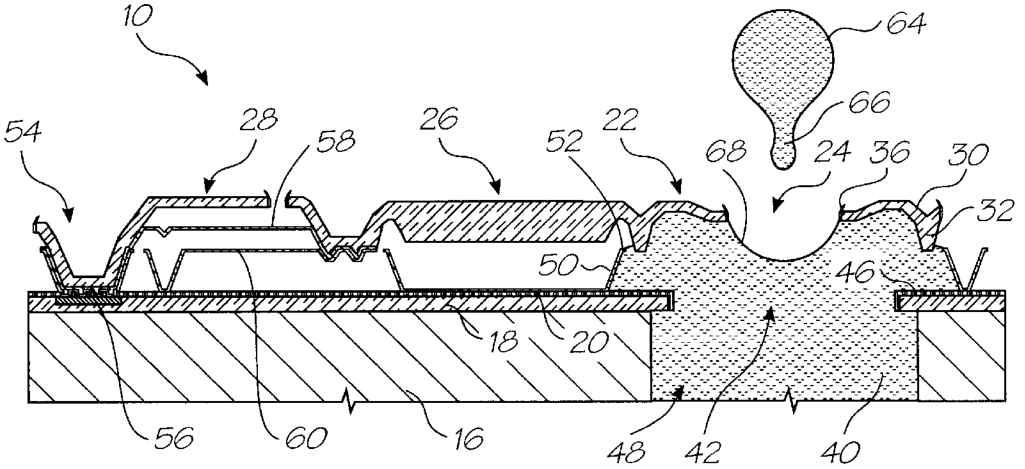

A further UV release tape (not shown) is applied to a rear of the wafer 16 and the tape 140 is removed. The sacrificial layers 108, 112, 120, 128 and 134 are stripped in oxygen plasma to provide the final nozzle assembly 10 as shown in FIGS. *8r* and *9r* of the drawings. For ease of reference, the reference numerals illustrated in these two drawings are the same as those in FIG. 1 of the drawings to indicate the relevant parts of the nozzle assembly 10. FIGS. 11 and 12 show the operation of the nozzle assembly 10, manufactured in accordance with the process described above with reference to FIGS. 8 and 9, and these figures correspond to FIGS. 2 to 4 of the drawings.

As is clear from the drawings and the description, the layer 116 forms the wall portion 50 as well as the passive beam 60 of the actuator 28. It follows that the steps of depositing the layer 116 and etching the layer 116 results in the fabrication of two components of each nozzle assembly.

As discussed in the background, the saving of a step or steps in the fabrication of a chip can result in the saving of substantial expenses in mass manufacture. It follows that the fact that the wall portion 50 can be fabricated in a common stage with the passive beam 60 of the actuator 28 saves a substantial amount of cost and time.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

I claim:

1. A method of fabricating a micro-electromechanical systems (MEMS) device that is positioned on a wafer substrate that incorporates drive circuitry, the method comprising the steps of depositing a first sacrificial layer of an organic material on the wafer substrate, patterning the first sacrificial layer to define openings, depositing a first layer of conductive material on the first sacrificial layer, patterning the first layer of conductive material, depositing a second sacrificial layer of organic material on the first layer of conductive material, patterning the second sacrificial layer, depositing a second layer of conductive material on the second sacrificial layer, patterning the second layer of conductive material, depositing a third sacrificial layer of organic material on the second layer of conductive material, patterning the third sacrificial layer, depositing a structural layer of dielectric material on the third sacrificial layer, patterning the structural layer, and removing the sacrificial layers to release MEMS structures defined by the first and second layers of conductive material and the structural layer.

2. A method as claimed in claim 1, which the steps of depositing the sacrificial layers comprises spinning on layers of photosensitive polyimide.

3. A method as claimed in claim 2, in which the steps of depositing and patterning the sacrificial material and conductive material and removing the sacrificial material are carried out so that the conductive material defines an actuator that is electrically connected to the drive circuitry.

4. A method as claimed in claim 3, in which the steps of depositing and patterning the sacrificial material, the conductive material and the dielectric material and removing the sacrificial material are carried out so that the dielectric material defines at least part of nozzle chamber walls and a roof wall that define a nozzle chamber and an ink ejection port in fluid communication with the nozzle chamber, the actuator being operatively positioned with respect to the nozzle chamber to eject ink from the ink ejection port.

5. A micro-electromechanical systems (MEMS) device that is the product of a process carried out according to the method of claim 1.

* * * * *